United States Patent
Young et al.

(10) Patent No.: US 10,447,303 B2
(45) Date of Patent: Oct. 15, 2019

(54) LOW-DENSITY PARITY CHECK (LDPC) INCREMENTAL PARITY-CHECK MATRIX ROTATION

(71) Applicant: QUALCOMM Incorporated, San Diego, CA (US)

(72) Inventors: Chi-Yuen Young, San Jose, CA (US); Jaeyoung Kwak, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 26 days.

(21) Appl. No.: 15/849,590

(22) Filed: Dec. 20, 2017

(65) Prior Publication Data
US 2019/0190543 A1   Jun. 20, 2019

(51) Int. Cl.
| | | |
|---|---|---|
| H03M 13/11 | (2006.01) | |
| H03M 13/00 | (2006.01) | |
| H04L 1/00 | (2006.01) | |

(52) U.S. Cl.
CPC .... *H03M 13/1137* (2013.01); *H03M 13/1105* (2013.01); *H03M 13/116* (2013.01); *H03M 13/118* (2013.01); *H03M 13/616* (2013.01); *H03M 13/6502* (2013.01); *H03M 13/6516* (2013.01); *H03M 13/6561* (2013.01); *H03M 13/1185* (2013.01); *H03M 13/1188* (2013.01); *H04L 1/0041* (2013.01); *H04L 1/0045* (2013.01)

(58) Field of Classification Search
CPC .......................... H03M 13/1137; H03M 13/616
See application file for complete search history.

(56) References Cited

U.S. PATENT DOCUMENTS

| | | | | |
|---|---|---|---|---|
| 8,095,859 B1 * | 1/2012 | Peterson | .............. | H03M 13/116 714/801 |
| 8,151,160 B1 * | 4/2012 | Andreev | ............ | H03M 13/1117 714/752 |

(Continued)

FOREIGN PATENT DOCUMENTS

EP            2712090 A2       3/2014

OTHER PUBLICATIONS

Ahmed M., et al., "A Low Complexity-High Throughput QC-LDPC Encoder", IEEE Transactions on Signal Processing, IEEE Service Center, New York, NY, US, vol. 62, No. 10, May 1, 2014 (May 1, 2014), XP011546461, ISSN: 1053-587X, DOI:10.1109/TSP.2014. 2314435, pp. 2696-2708, [retrieved on Apr. 25, 2014].

(Continued)

*Primary Examiner* — Joseph D Torres
(74) *Attorney, Agent, or Firm* — Loza & Loza, LLP

(57) ABSTRACT

Aspects of the present disclosure relate to parity-check matrix (P-matrix) rotation in low-density parity check (LDPC) coding. The P-matrix rotation may be performed by a plurality of shift registers, where each shift register is configured to receive a respective set of bits corresponding to a respective column in the P-matrix. Each cycle, the shift registers may then incrementally rotate their respective sets of bits to achieve a respective shift amount up to a maximum shift amount per cycle. During a cycle, if the shift amount produced by a shift register results in a degree of rotation corresponding to an element within the respective column of the P-matrix, the shift register may output the rotated set of bits for further processing.

31 Claims, 14 Drawing Sheets

(56) References Cited

U.S. PATENT DOCUMENTS

| | | | | |
|---|---|---|---|---|
| 8,266,493 | B1* | 9/2012 | Abbaszadeh | H03M 13/1134 375/240.24 |
| 8,966,339 | B1 | 2/2015 | Lu | |
| 9,577,675 | B1 | 2/2017 | Varnica et al. | |
| 9,727,419 | B2 | 8/2017 | Wu et al. | |
| 2005/0078765 | A1* | 4/2005 | Jeong | H04L 1/0057 375/267 |
| 2005/0204261 | A1* | 9/2005 | Kan | H03M 13/116 714/755 |
| 2007/0036353 | A1* | 2/2007 | Reznik | H04B 7/0434 380/30 |
| 2008/0065956 | A1* | 3/2008 | Blankenship | H03M 13/1102 714/758 |
| 2009/0146849 | A1* | 6/2009 | Liu | H03M 13/1105 341/50 |
| 2010/0199153 | A1* | 8/2010 | Okamura | H03M 13/118 714/781 |
| 2010/0269009 | A1* | 10/2010 | Okamura | H03M 13/116 714/752 |
| 2013/0055049 | A1* | 2/2013 | Murakami | H03M 13/1154 714/779 |
| 2014/0161209 | A1* | 6/2014 | Limberg | H04L 5/0016 375/299 |
| 2017/0149446 | A1* | 5/2017 | Tao | H03M 13/1117 |
| 2018/0159557 | A1* | 6/2018 | Shinohara | H03M 13/19 |
| 2018/0331695 | A1* | 11/2018 | Fisher-Jeffes | H03M 13/036 |

OTHER PUBLICATIONS

Anggraeni S., et al., "Optimized Encoder Architecture for Structured LowDensity Parity Check Codes of Short Length", The Institute of Electrical and Electronics Engineers, Inc. (IEEE) Conference Proceedings, Jun. 1, 2014 (Jun. 1, 2014), XP055565996, Piscataway, 4 Pages.

International Search Report and Written Opinion—PCT/US2018/066511—ISA/EPO—dated Mar. 29, 2019.

Jung Y., et al., "Memory-Efficient and High-Speed LDPC Encoder", Electronic Letters, The Institution of Engineering and Technology, IET, vol. 46, No. 14, Jul. 12, 2010 (Jul. 12, 2010), XP006036674, ISSN: 1350-911X, DOI: 10.1049/EL:20101189, pp. 1035-1036.

Li Z., et al, "Efficient Encoding of Quasi-Cyclic Low-Density Parity-CheckCodes", IEEE Transactions on Communications, IEEE Service Center, Piscataway, NJ, USA, vol. 54, No. 1, Jan. 1, 2006 (Jan. 1, 2006), XP002489550, ISSN: 0090-6778, DOI:10.1109/TCOMM.2005.861667, pp. 71-81.

Peng X., et al., "Generic Permutation Network for QC-LDPC Decoder", IEICE Transactions on Fundamentals of Electronics, Communications and Computer Sciences, Engineering Sciences Society, Tokyo, JP, vol. E93A, No. 12, Dec. 1, 2010 (Dec. 1, 2010), XP001559609, ISSN: 0916-8508, DOI:10.1587/TRANSFUN.E93.A.2551, pp. 2551-2559.

Perez J.M., et al., "Low-Cost Encoding of IEEE 802.11n", Electronics LET, IEE Stevenage, GB, vol. 44, No. 4, Feb. 14, 2008 (Feb. 14, 2008), XP006030511, ISSN: 0013-5194, pp. 307-308.

Zhang P., et al., "Parallel-in Encoding of Quasi-Cyclic Low-Density Parity-Check Codes", The Journal of Engineering, vol. 2016, No. 7, Jul. 1, 2016 (Jul. 1, 2016), XP055565260, DOI:10.1049/joe.2016.0122, pp. 227-229.

* cited by examiner $$H = \begin{bmatrix} c_1 & c_2 & c_3 & c_4 & c_5 & c_6 & c_7 & c_8 & c_9 & c_{10} & c_{11} & c_{12} \\ 0 & 1 & 0 & 0 & 1 & 1 & 1 & 0 & 0 & 0 & 0 & 1 \\ 1 & 1 & 0 & 0 & 1 & 0 & 0 & 0 & 1 & 1 & 1 & 0 \\ 0 & 1 & 0 & 0 & 0 & 1 & 1 & 1 & 0 & 0 & 0 & 1 \\ 0 & 0 & 1 & 0 & 0 & 0 & 1 & 1 & 1 & 0 & 0 & 1 \\ 1 & 0 & 0 & 1 & 0 & 0 & 0 & 1 & 1 & 1 & 0 & 0 \\ 1 & 0 & 0 & 0 & 1 & 0 & 0 & 0 & 1 & 1 & 1 & 0 \\ 0 & 0 & 0 & 1 & 1 & 1 & 0 & 1 & 0 & 0 & 1 & 1 \\ 0 & 1 & 1 & 0 & 0 & 1 & 0 & 0 & 0 & 1 & 0 & 0 \end{bmatrix}$$

FIG. 3

Time

| P-matrix rotation | 0 | 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|---|---|
| 384 | | | | | | | | | | | ... | | | | | | | | | | | |
| | | | | | | | | | | | | | | | | | | | | | | |
| . | | | | | | | | | | | | | | | | | | | | | | |
| . | | | | | | | | | | | | | | | | | | | | | | |
| . | | | | | | | | | | | ... | | | | | | | | | | | |
| | | | | | | | | | | | | | | | | | | | | | | |
| 21 | 7 | 8 | 7 | 7 | 7 | 7 | 7 | 7 | 7 | 7 | 7 | 7 | 8 | 7 | 7 | 7 | 7 | 7 | 7 | 7 | 8 | 7 |
| 20 | 7 | 8 | 7 | 7 | 7 | 7 | 7 | 7 | 7 | 7 | 7 | 7 | 7 | 7 | 7 | 7 | 7 | 7 | 7 | 7 | 8 | 7 |
| 19 | 7 | 8 | 7 | 7 | 7 | 7 | 7 | 7 | 7 | 7 | 7 | 7 | 7 | 7 | 7 | 7 | 7 | 7 | 7 | 7 | 7 | 7 |
| 18 | 6 | 6 | 6 | 6 | 6 | 6 | 6 | 6 | 6 | 6 | 6 | 6 | 7 | 6 | 6 | 6 | 6 | 6 | 6 | 6 | 7 | 6 |
| 17 | 6 | 6 | 6 | 6 | 6 | 6 | 6 | 6 | 6 | 6 | 6 | 6 | 8 | 6 | 6 | 6 | 6 | 6 | 6 | 6 | 7 | 6 |
| 16 | 6 | 6 | 6 | 6 | 6 | 6 | 6 | 6 | 6 | 6 | 6 | 6 | 6 | 6 | 6 | 6 | 6 | 6 | 6 | 6 | 6 | 6 |
| 15 | 5 | 5 | 5 | 5 | 5 | 5 | 5 | 5 | 5 | 5 | 5 | 5 | 5 | 5 | 5 | 5 | 5 | 5 | 5 | 5 | 6 | 5 |
| 14 | 5 | 5 | 5 | 5 | 5 | 5 | 5 | 5 | 5 | 5 | 5 | 5 | 5 | 5 | 5 | 5 | 5 | 5 | 5 | 5 | 6 | 5 |
| 13 | 5 | 5 | 5 | 5 | 5 | 5 | 5 | 5 | 5 | 5 | 5 | 5 | 5 | 5 | 5 | 5 | 5 | 5 | 5 | 5 | 8 | 5 |
| 12 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |
| 11 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |
| 10 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |
| 9 | 3 | 3 | 3 | 3 | 3 | 3 | 3 | 3 | 3 | 3 | 3 | 3 | 3 | 3 | 3 | 3 | 3 | 3 | 3 | 3 | 3 | 3 |
| 8 | 3 | 3 | 3 | 3 | 3 | 3 | 3 | 3 | 3 | 3 | 3 | 3 | 3 | 3 | 3 | 3 | 3 | 3 | 3 | 3 | 3 | 3 |
| 7 | 3 | 3 | 3 | 3 | 3 | 3 | 3 | 3 | 3 | 3 | 3 | 3 | 3 | 3 | 3 | 3 | 3 | 3 | 3 | 3 | 3 | 3 |
| 6 | 2 | 2 | 2 | 2 | 2 | 2 | 2 | 2 | 2 | 2 | 2 | 2 | 2 | 2 | 2 | 2 | 2 | 2 | 2 | 2 | 2 | 2 |
| 5 | 2 | 2 | 2 | 2 | 2 | 2 | 2 | 2 | 2 | 2 | 2 | 2 | 2 | 2 | 2 | 2 | 2 | 2 | 2 | 2 | 2 | 2 |
| 4 | 2 | 2 | 2 | 2 | 2 | 2 | 2 | 2 | 2 | 2 | 2 | 2 | 2 | 2 | 2 | 2 | 2 | 2 | 2 | 2 | 2 | 2 |
| 3 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 2 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 0 | 0 | 0 | 0 | 8 | 0 | 0 | 0 | 0 | 0 | 0 | 0 | 0 | 0 | 0 | 0 | 0 | 0 | 0 | 0 | 0 | 0 | 0 |

FIG. 10

LOW-DENSITY PARITY CHECK (LDPC) INCREMENTAL PARITY-CHECK MATRIX ROTATION

TECHNICAL FIELD

The technology discussed below relates generally to wireless communication systems, and more particularly, to low-density parity check (LDPC) coding.

INTRODUCTION

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

For future networks, such as fifth generation (5G) New Radio networks, LDPC codes may continue to be implemented to support a wide range of information block lengths and a wide range of code rates. In order to achieve a high throughput with efficient hardware utilization, additional enhancements of LDPC codes are desired.

BRIEF SUMMARY OF SOME EXAMPLES

The following presents a summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

Various aspects of the disclosure relate to the performance of parity-check matrix (P-matrix) rotation in low-density parity check (LDPC) coding. The P-matrix rotation may be performed by a plurality of shift registers, where each shift register is configured to receive a respective set of bits corresponding to a respective column in the P-matrix. The bits may correspond to information bits to be encoded utilizing LDPC encoding or coded bits to be decoded utilizing LDPC decoding. Each cycle, the shift registers may incrementally rotate (e.g., cyclically shift) their respective sets of bits to achieve a respective individual shift amount corresponding to a number of bit positions. The respective individual shift amount of each shift register may be less than or equal to a maximum shift amount per cycle. In some examples, the maximum shift amount per cycle corresponds to three bit positions.

During a cycle, if the individual shift amount produced by a first shift register results in a degree of rotation corresponding to an element within the respective column of the P-matrix associated with the first shift register, the first shift register may output a first rotated set of bits to a multiplexer, where the first rotated set of bits includes the respective set of bits in shifted bit positions corresponding to the degree of rotation. The multiplexer may then output the first rotated set of bits to an output buffer. Based on the parity check equations in the P-matrix, the output buffer may provide the first rotated set of bits to a multiplier (e.g., XOR logic) to multiply (e.g., XOR) the first rotated set of information bits with a second rotated set of information bits produced by a second shift register to produce a partial result, where the first rotated set of information bits and the second set of rotated information bits are each included within a first parity check equation indicated by the P-matrix. The output buffer may then store the partial result and utilize the partial result in subsequent multiplication (XOR) operations for the first parity check equation to produce a final result. In some examples, the final result may be utilized to compute a set of parity bits corresponding to a parity column in the P-matrix. In other examples, the final result may be utilized to compute a parity check result.

In one aspect of the disclosure, a method utilized in low-density parity check (LDPC) coding is provided. The method includes loading respective sets of bits corresponding to respective columns in a parity-check matrix into respective ones of a plurality of shift registers. The method further includes, in each of a plurality of cycles, incrementally cyclically shifting the respective sets of bits in each of the plurality of shift registers to achieve respective individual shift amounts less than or equal to a maximum shift amount per cycle, where the maximum shift amount is less than a number of bits within each of the respective sets of bits and the maximum shift amount corresponds to a number of bit positions. The method further includes, during a cycle of the plurality of cycles, outputting a first rotated set of bits from a first shift register of the plurality of shift registers when a degree of rotation of the respective set of bits within the first shift register produced as a result of the respective individual shift amount of the first shift register corresponds to an element within the respective column of the parity-check matrix associated with the first shift register.

Another aspect of the disclosure provides an apparatus configured for low-density parity check (LDPC) coding. The apparatus includes a memory configured to maintain a parity-check matrix, LDPC coding circuitry including a plurality of shift registers, each coupled to a plurality of multiplexers, and a processor communicatively coupled to the memory and the LDPC coding circuitry. The processor is configured to load respective sets of bits corresponding to respective columns in a parity-check matrix into respective ones of the plurality of shift registers. The processor is further configured to, in each of a plurality of cycles, incrementally cyclically shift the respective sets of bits in each of the plurality of shift registers utilizing the plurality of multiplexers to achieve respective individual shift amounts less than or equal to a maximum shift amount per cycle, where the maximum shift amount is less than a number of bits within each of the respective sets of bits and the maximum shift amount corresponds to a number of bit positions. The processor is further configured to, during a cycle of the plurality of cycles, output a first rotated set of bits from a first shift register of the plurality of shift registers when a degree of rotation of the respective set of bits within the first shift register produced as a result of the respective individual shift amount of the first shift register corresponds to an element within the respective column of the parity-check matrix associated with the first shift register.

Another aspect of the disclosure provides a wireless communication device configured for LDPC coding. The wireless communication device includes means for loading respective sets of bits corresponding to respective columns in a parity-check matrix into respective ones of a plurality of shift registers. The wireless communication device further includes means for incrementally cyclically shifting the respective sets of bits in each of the plurality of shift registers during a cycle of a plurality of cycles to achieve respective individual shift amounts less than or equal to a maximum shift amount per cycle, where the maximum shift amount is less than a number of bits within each of the respective sets of bits and the maximum shift amount corresponds to a number of bit positions. The wireless communication device further includes means for outputting a first rotated set of bits from a first shift register of the plurality of shift registers during the cycle when a degree of rotation of the respective set of bits within the first shift register produced as a result of the respective individual shift amount of the first shift register corresponds to an element within the respective column of the parity-check matrix associated with the first shift register.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 3 illustrates an example of a low-density parity check (LDPC) matrix according to some aspects of the present disclosure.

FIG. 10 illustrates an exemplary rotation of a portion of the P-matrix shown in FIG. 6 over time according to some aspects of the present disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
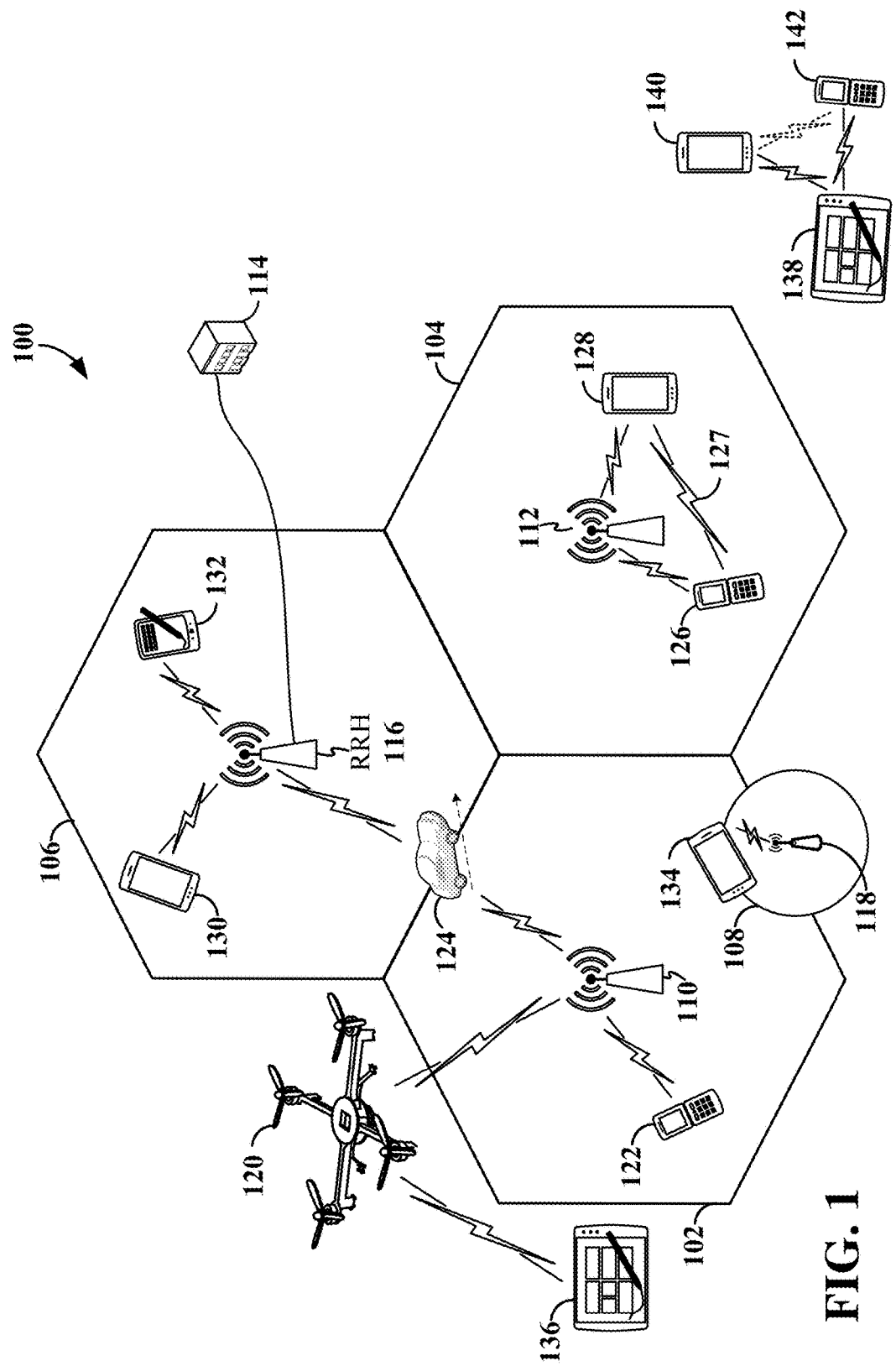
FIG. 1 is a diagram illustrating an example of a radio access network according to some aspects of the present disclosure.

The various concepts presented throughout this disclosure may be implemented across a broad variety of telecommunication systems, network architectures, and communication standards. Referring now to FIG. 1, as an illustrative example without limitation, a schematic illustration of a radio access network 100 is provided. In some examples, the radio access network 100 may be a network employing continued evolved wireless communication technologies. This may include, for example, a fifth generation (5G) or New Radio (NR) wireless communication technology based on a set of standards (e.g., issued by 3GPP, www.3gpp.org). For example, standards defined by the 3GPP following LTE-Advanced or by the 3GPP2 following CDMA2000 may be considered 5G. Standards may also include pre-3GPP efforts specified by Verizon Technical Forum and Korea Telecom SIG.

In other examples, the radio access network 100 may be a network employing a third generation (3G) wireless communication technology or a fourth generation (4G) wireless communication technology. For example, standards promulgated by the 3rd Generation Partnership Project (3GPP) and the 3rd Generation Partnership Project 2 (3GPP2) may be considered 3G or 4G, including but not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB) or some other suitable terminology.

In FIG. 1, two base stations 110 and 112 are shown in cells 102 and 104; and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion (not shown) of the network. The backhaul may provide a link between a base station and a core network (not shown), and in some examples, the backhaul may provide interconnection between the respective base stations. The core network may be a part of a wireless communication system and may be independent of the radio access technology used in the radio access network. Various types of backhaul interfaces may be employed, such as a direct physical connection, a virtual network, or the like using any suitable transport network.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, a medical device, implantable devices, industrial equipment, and many other devices sized, shaped, and configured for use by users.

Within the radio access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells. UEs may comprise a number of hardware structural components sized, shaped, and arranged to help in communication; such components can include antennas, antenna arrays, RF chains, amplifiers, one or more processors, etc. electrically coupled to each other.

In another example, a mobile network node (e.g., quadcopter 120) may be configured to function as a UE. For example, the quadcopter 120 may operate within cell 102 by communicating with base station 110. In some aspects of the present disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or traffic information (e.g., user data traffic) from a base station (e.g., base station 110) to one or more UEs (e.g., UEs 122 and 124) may be referred to as downlink (DL) transmission, while transmissions of control information and/or traffic information originating at a UE (e.g., UE 122) may be referred to as uplink (UL) transmissions. In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

The air interface in the radio access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), discrete Fourier transform spread orthogonal frequency division multiple access (DFT-s-OFDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), discrete Fourier transform spread orthogonal frequency division multiplexing (DFT-s-OFDM) or other suitable multiplexing schemes.

Further, the air interface in the radio access network 100 may utilize one or more duplexing algorithms Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of an access and mobility management function (AMF), which may include a security context management function (SCMF) that manages the security context for both the control plane and the user plane functionality and a security anchor function (SEAF) that performs authentication. In various aspects of the disclosure, a radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe/slot timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the radio access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. When the signal strength or quality of the pilot signal measured by a neighboring cell exceeds that of the signal strength or quality measured by the serving cell, the radio access network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
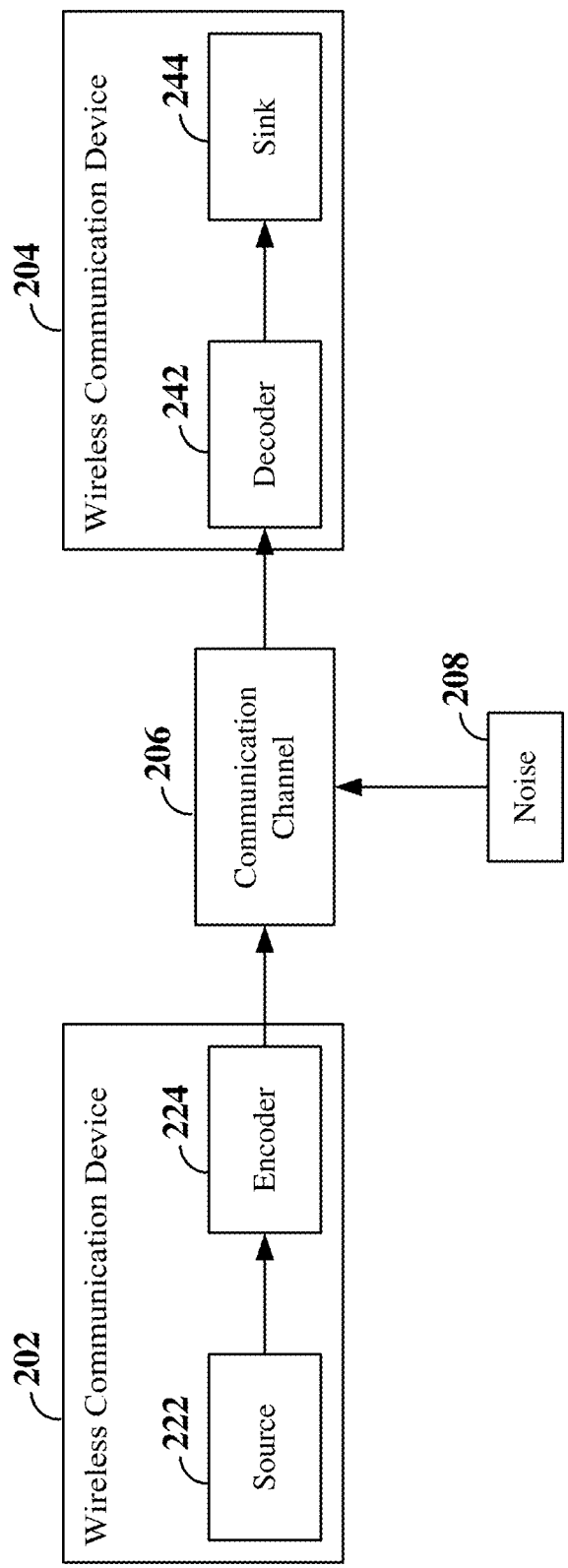
FIG. 2 is a schematic illustration of wireless communication utilizing block codes according to some aspects of the present disclosure.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel) to a sink 244 in the second wireless communication device 204. To provide for reliable communication of the digital message, it is usually beneficial to take into account the noise 208 that affects the communication channel 206.

Block codes, or error correcting codes are frequently used to provide reliable transmission of digital messages over such channels. In a typical block code, an information message or sequence is split up into blocks, each block having a length of K bits. An encoder 224 at the first (transmitting) wireless communication device 202 then mathematically adds redundancy to the information message, resulting in codewords having a length of N, where N>K. Here, the code rate R is the ratio between the message length and the block length: i.e., R=K/N. Exploitation of this redundancy in the encoded information message is one key to reliability of the message, possibly enabling correction for bit errors that may occur due to the noise 208 or other signal propagation affects. That is, a decoder 242 at the second (receiving) wireless communication device 204 can take advantage of the redundancy to possibly recover the information message even though bit errors may occur, in part, due to the addition of noise to the channel, etc.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

LDPC codes are linear forward error correcting codes, where each codeword of length N contains K information bits and C parity check bits (N=K+C). The symbols in an LDPC codeword satisfy C parity check equations of the form:

$$c_a \oplus c_b \oplus c_c \oplus \ldots \oplus c_Z = 0.$$

where $c_a$, $c_b$, $c_c$, ..., $c_z$ are the code bits in the parity check equation and $\oplus$ refers to modulo 2 addition (e.g., an exclusive or operation).

LDPC codes may be defined by a sparse parity-check matrix H. A parity-check matrix is a C-row by N-column binary matrix. The rows represent the parity check equations and the columns represent the bits in the codeword. There is a "one" in the i-th row and j-th column if the j-th code bit is contained in the i-th parity check equation. The parity-check matrix is sparse in that the matrix has a low density of ones. This sparsity renders low complexity decoding and leads to a simple implementation.

An example of a parity-check matrix H is shown in FIG. 3. In the example shown in FIG. 3, the length (N) of the codeword is twelve and the number of parity check bits (C) is nine. Therefore, the parity-check matrix H is a 12×9 matrix, with nine parity check equations and twelve bits.

Each parity check equation is formed from the code bits $c_1$-$c_{12}$ corresponding to the nonzero locations in each row. For example, the first parity check equation corresponding to the first row may be represented as $c_3 \oplus c_6 \oplus 7 \oplus c_8 = 0$. Thus, the first parity check equation includes the code bits $c_3$, $c_6$, $c_7$, and $c_8$ in the codeword. Similar equations may be constructed for each of the other rows based on the nonzero elements in each row. The matrix H shown in FIG. 3 represents a regular LDPC code in that every code bit is contained in the same number of equations and each equation contains the same number of code bits. For example, in FIG. 3, each code bit $c_1$-$c_{12}$ is contained in three equations and each equation contains four code bits. In other examples, the LDPC code may be irregular, which includes a variable number of ones in the rows and columns.

Figure 4:
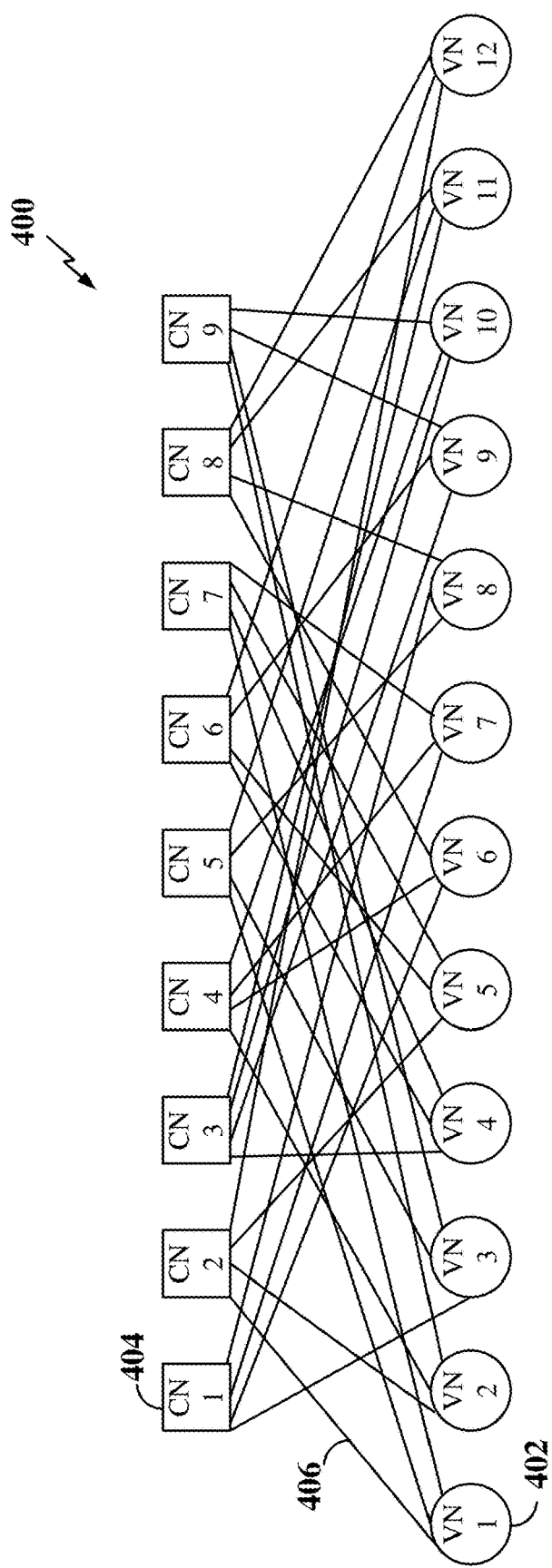
FIG. 4 illustrates an example of a LDPC base graph according to some aspects of the present disclosure.

Decoding of LDPC codes may best be understood by a graphical description. FIG. 4 illustrates an example of an LDPC graph 400 corresponding to the parity-check matrix H shown in FIG. 3. The graph 400 has two types of nodes: variable nodes (VN1-VN12) 402 and check nodes (CN1-CN9) 404. Each variable node represents a code bit and each check node represents a parity check equation. A line is drawn between a variable node and a check node if the code bit associated with the variable node is contained within the parity check equation associated with the check node. Each line may be referred to herein as an edge 406. Thus if a j-th variable node 402 is connected to an i-th check node 404 by an edge 406, i.e., the two nodes are neighbors, then there is a "1" in the i-th column and in the j-th row of the parity-check matrix H. That is, the intersection of an-i-th row and a j-th column contains a "1" where an edge 406 joins the corresponding nodes 402 and 404 and a "0" where there is no edge. As such, each edge 406 corresponds to a non-zero element in the parity-check matrix.

The degree of a node refers to the number of edges connected to that node. This feature is illustrated in the H matrix shown in FIG. 4 where the number of edges incident to a variable node 402 is equal to the number of 1's in the corresponding column and is called the variable node degree d(v). Similarly, the number of edges connected with a check node 404 is equal to the number of ones in a corresponding row and is called the check node degree d(c). Since the graph shown in FIG. 4 corresponds to the parity-check matrix shown in FIG. 3, each variable node 402 has three edges 406 connecting it to check nodes 404 and each check node 404 has four edges 406 connecting it to variable nodes 402. A regular graph or code is one for which all variable nodes have the same degree, j, and all check nodes have the same degree, k. In this case, we say that the code is a (j, k) regular code. On the other hand, an irregular code has check nodes and/or variable nodes of differing degrees. For example, some variable nodes may be of degree 4, others of degree 3 and still others of degree 2.

A bit sequence associated one-to-one with the bit node sequence is a codeword of the code if and only if, for each check node 404, the bits neighboring the check node 404 (via their association with variable nodes 402) sum to zero modulo two, i.e., they comprise an even number of ones. In some cases, some of these bits might be punctured or known. Puncturing refers to the act of removing bits from a codeword to yield, in effect, a shorter codeword of a desired granularity. In the case of LDPC graphs, this means that some of the bit nodes 402 in the graph correspond to bits that are not actually transmitted. Puncturing a variable node 402 in an LDPC code creates a shortened code (e.g. due to the removal of a bit), while also effectively removing a check node 404. Specifically, for a matrix representation of an LDPC code, including bits to be punctured, where the variable node 402 to be punctured has a degree of one (such a representation may be possible through row combining provided the code is proper), puncturing the variable node 402 removes the associated bit from the code and effectively removes its single neighboring check node 404 from the graph. As a result, the number of check nodes 404 in the graph is reduced by one.

The LDPC decoder and decoding algorithm used to decode LDPC codewords operate by exchanging messages within the graph 400 along the edges 406 and updating these messages by performing computations at the nodes 402 and 404 based on the incoming messages. Each variable node 402 in the graph 400 is initially provided with a soft bit that indicates an estimate of the probability that the bit is a one, as determined by observations from, e.g., the communications channel (e.g., the channel estimate). The variable node 402 broadcasts this soft bit (initial estimate) to the check nodes 404 on the edges 406 connected to that variable node 402. Each check node 404, in turn, generates first new estimates for the bits involved in that parity check equation and sends back these first new estimates on the edges 406 back to the variable nodes 402. The first new estimates are calculated based upon all of the initial estimates furnished to the parity node.

For example, consider the first check node CN1 corresponding to the equation $c_3 \oplus c_6 \oplus 7 \oplus c_8 = 0$. This check node may receive initial estimates $e_3$, $e_6$, $e_7$, and $e_8$ from the variable nodes VN3, VN6, VN7, and VN8 corresponding to the code bits $c_3$, $c_6$, $c_7$, and $c_8$. The first new estimate for the variable node VN3 corresponding to code bit $c_3$ may then be calculated as:

$$e'_3 = e_6(1-e_7)(1-e_8) + e_7(1-e_6)(1-e_8) + e_8(1-e_6)(1-e_7) + e_6 e_7 e_8.$$

Similar calculations may be made for the new estimates for the remaining variable nodes.

As a result, each variable node 402 is provided different first new estimates by each of the check nodes 404 connected to it. Each variable node 402 may then determine a respective second new estimate for each of the check nodes 404 connected to it based on the original channel estimate together with a combination of the first new estimates received from each check node (except the check node to which the additional new estimate is sent). Thus, in determining the second new estimate sent from the variable node 402 to a check node 404, the variable node 402 ignores the first new estimate received from that check node 404. For example, variable node VN3 will ignore the first new estimate sent from check node CN1 when determining the second new estimate for check node CN1. The second new estimate for a particular check node may then be calculated, for example, as a normalized product of the first new estimates received from the other check nodes 404, taking into consideration the original channel estimate. This process repeats with check nodes 404 passing edge messages (estimates) to variable nodes 402 and variable nodes 402 passing edge messages (estimates) to check nodes 404 until a final estimate is computed at each variable node 402 by computing the normalized product of all of the estimates. A hard decision on each bit may then be made by comparing the final estimate with a threshold (e.g., 0.5).

In some examples, the graph 400 shown in FIG. 4 may be considered a base graph. As used herein, the term "base graph" refers to an LDPC graph having dimensions less than that necessary to produce the minimum codeword length utilized in a wireless communication network (e.g., the radio access network 100 shown in FIG. 1). To produce an LDPC graph corresponding to a desired information block length K and code rate R, each of the elements in the LDPC parity-check matrix representing the LDPC graph may be lifted (e.g., replaced with another matrix) by a lift size Z (e.g., $K_b*Z=K$). For example, if the base graph is represented by a 3×3 matrix and a lift size Z of three is applied to the base graph, the resulting lifted parity-check matrix is a 9×9 matrix to support a codeword having nine code bits (e.g., where each column in the matrix is associated with a set of three of the code bits). In effect, lifting is a technique for generating a relatively large LDPC code from multiple copies of a smaller base code. The largest lift size $Z_{max}$ represents the largest degree of parallelism that may be achieved per edge in the base graph, corresponding to the largest information block length $K_{max}$ In some examples, construction of the lifted parity-check matrix may involve replacing each of the elements of the base parity-check matrix with a square submatrix of size Z×Z (the lift size), where each submatrix is either a cyclic-permutation of the identity matrix or a null submatrix. For example, for a submatrix size of 3×3, corresponding to a lift size of three, the submatrix $P_0$ may be the identity matrix and other submatrices $P_i$ may be obtained by cyclically-shifting the columns to the right by i elements.

Each element in the base parity-check matrix may then contain an identity of the lifted submatrix (e.g., $P_i$ or *, where * indicates a null matrix). If an element includes a lifted submatrix identity, then the set of bits associated with the column containing the element are cyclically shifted (rotated) by an amount corresponding to the submatrix identity. Using the above example of a lift size of three, there are three bits associated with each column, and if a particular element in a column contains $P_2$, the bits associated with that column would be shifted to the right by two bit positions. For example, the code bits [0 1 0] would be shifted to [1 0 0]. In some examples, the base parity-check matrix may support a maximum of twenty-two information bits (also referred to herein as systematic bits) with a maximum lift size of three-hundred eighty-four.

Figure 5:
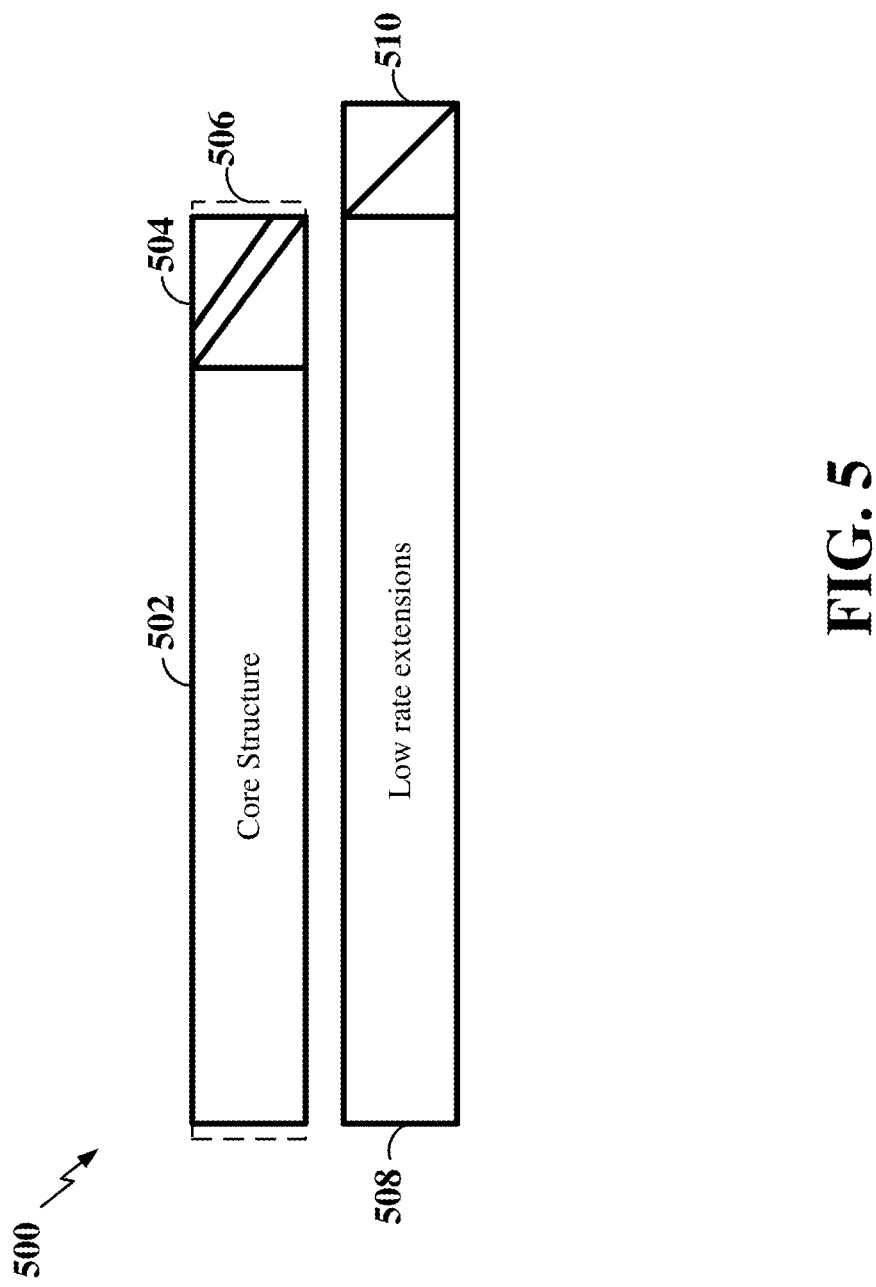
FIG. 5 illustrates a general structure of an exemplary base parity check matrix (P-matrix) according to some aspects of the present disclosure.

FIG. 5 shows a general structure 500 of an exemplary base parity-check matrix (P-matrix) that may be utilized for both LDPC encoding and LDPC decoding (e.g., together with a corresponding LDPC base graph). The exemplary base P-matrix includes a core structure 502 with degree-three or higher variable nodes that forms the set of information (systematic) bit-columns. The P-matrix structure 500 further includes a parity structure 504, which includes an accumulated chain of degree-two parity bits. Alternate coding structures may be used, for example to support deeper error floors, and the disclosed techniques may be applied to such variations on the coding structure.

The portion of the P-matrix structure 500 including the core structure 502 and parity structure 504 may be referred to herein as a core graph 506. The core graph 506 has an associated code rate determined by its parameters. In some cases, some of the parity bits in the core graph 506 might be punctured to support coding rates above the rate of the core graph 506.

FIG. 5 also depicts low-rate extensions 508 and additional degree-one parity bits 510. While optional, the low-rate extensions 508 and degree-one parity bits 510 may extend the P-matrix for further incremental redundancy hybrid automatic repeat request (IR-HARQ) transmissions or, in general, for defining codes of lower rate than the rate associated with the core graph 506. The complete graph or some portion beyond the core graph may be referred to as an extended graph.

Figure 6:
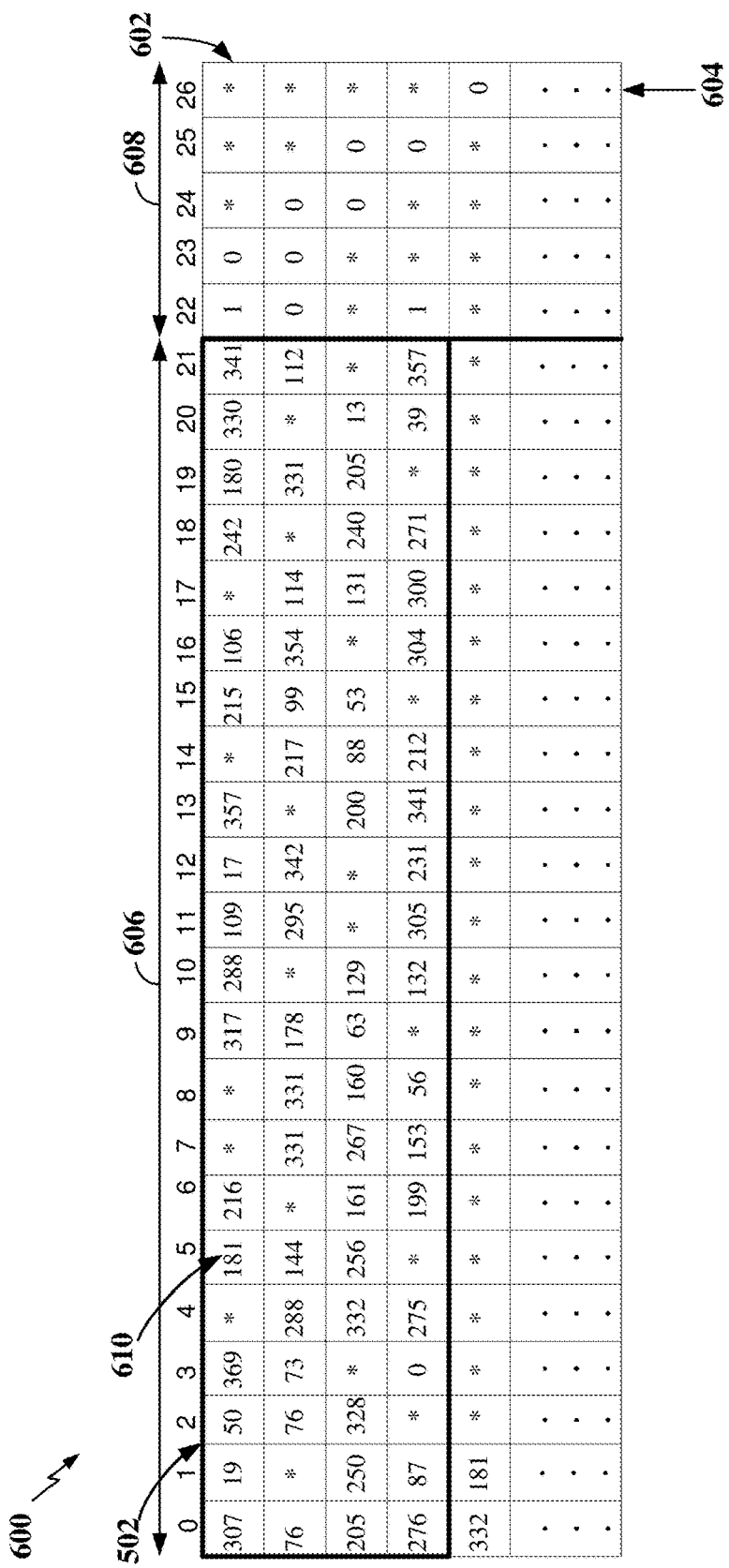
FIG. 6 illustrates a portion of an exemplary P-matrix according to some aspects of the present disclosure.

FIG. 6 illustrates a portion of an exemplary P-matrix 600 according to some aspects of the present disclosure. The P-matrix 600 includes a plurality of rows 602 and columns 604. Each of the rows 602 represents a parity check equation, while each of the columns 604 represents a set of bits, where each set of bits may include a number of bits corresponding to the lift size. The columns 604 may be divided into information bit columns 606 and parity bit columns 608. The information bit columns 606 correspond to the information (systematic) bits, while the parity bit columns 608 correspond to the parity bits.

In the example shown in FIG. 6, twenty-seven columns (columns 0-26) are illustrated. However, it should be understood that this may represent only a portion of the number of columns in the P-matrix 600. In addition, in the example shown in FIG. 6, there are twenty-two information bit columns 606, with the first four rows 602 of information bit columns 606 corresponding to the core structure 502 shown in FIG. 5. However, the number of information bit columns 606 may vary, depending on the encoding structure utilized. The remaining rows 602 below the core structure 502 may correspond to the low rate extensions 508 shown in FIG. 5, which may include any number of additional rows 602.

The first parity bit column (column 22) corresponds to a set of degree-three parity bits, while the second, third, and fourth parity columns (columns 23-25) correspond to respective sets of degree-two parity bits. Thus, in some examples, columns 22-25 may correspond to the parity structure 504 shown in FIG. 5. The degree-one parity bits corresponding to the parity bit extension 510 shown in FIG. 5 may begin in column 26.

Each element 610 of the P-matrix 600 contains an identity of the lifted submatrix (e.g., $P_i$ or *, where * indicates a null matrix and i=0 . . . Z). In FIG. 6, only the subscript i is shown in each element 610, for simplicity. If an element 610 includes a lifted submatrix identity, then the set of bits associated with the column containing the element are cyclically shifted (rotated) by an amount corresponding to the submatrix identity. For example, the element 610 in the first row 602 and sixth column 604 contains the submatrix identity of 181 ($P_{181}$). Thus, for this element 610, the set of bits associated with the sixth column are rotated (shifted) by 181 bit positions within the set of bits. For example, each bit within the set of bits associated with the sixth column may be shifted to the right by 181 bit positions and wrapping around to the left-most bit position. Thus, the submatrix identity within each element 610 of the P-matrix 600 indicates a degree of rotation of the respective set of the bits corresponding to the column 604 containing the element 610.

In various aspects of the disclosure, the P-matrix rotations indicated in the elements 610 of the P-matrix 600 may be performed utilizing shift registers. For example, each set of bits associated with each information bit column 606 of the P-matrix may be loaded into a respective shift register and the rotations may be incrementally performed within each shift register. In some examples, during a cycle, each shift register may be configured to cyclically shift the respective set of bits by a respective individual shift amount. Each individual shift amount may be any shift amount up to a maximum shift amount allowed per cycle, where the maximum shift amount is less than the lift size (e.g., less than the number of bits within a particular shift register). If the individual shift amount applied to a particular shift register results in a degree of rotation (e.g., submatrix identity) indicated in one of the elements 610 within the respective column of the P-matrix 600, that particular shift register may output the rotated set of bits for further processing. By providing at least a shift register for each information bit column 606 within the P-matrix, all of the information bits may be available each cycle to increase the throughput and reduce the latency of performing the P-matrix rotations.

Figure 7:
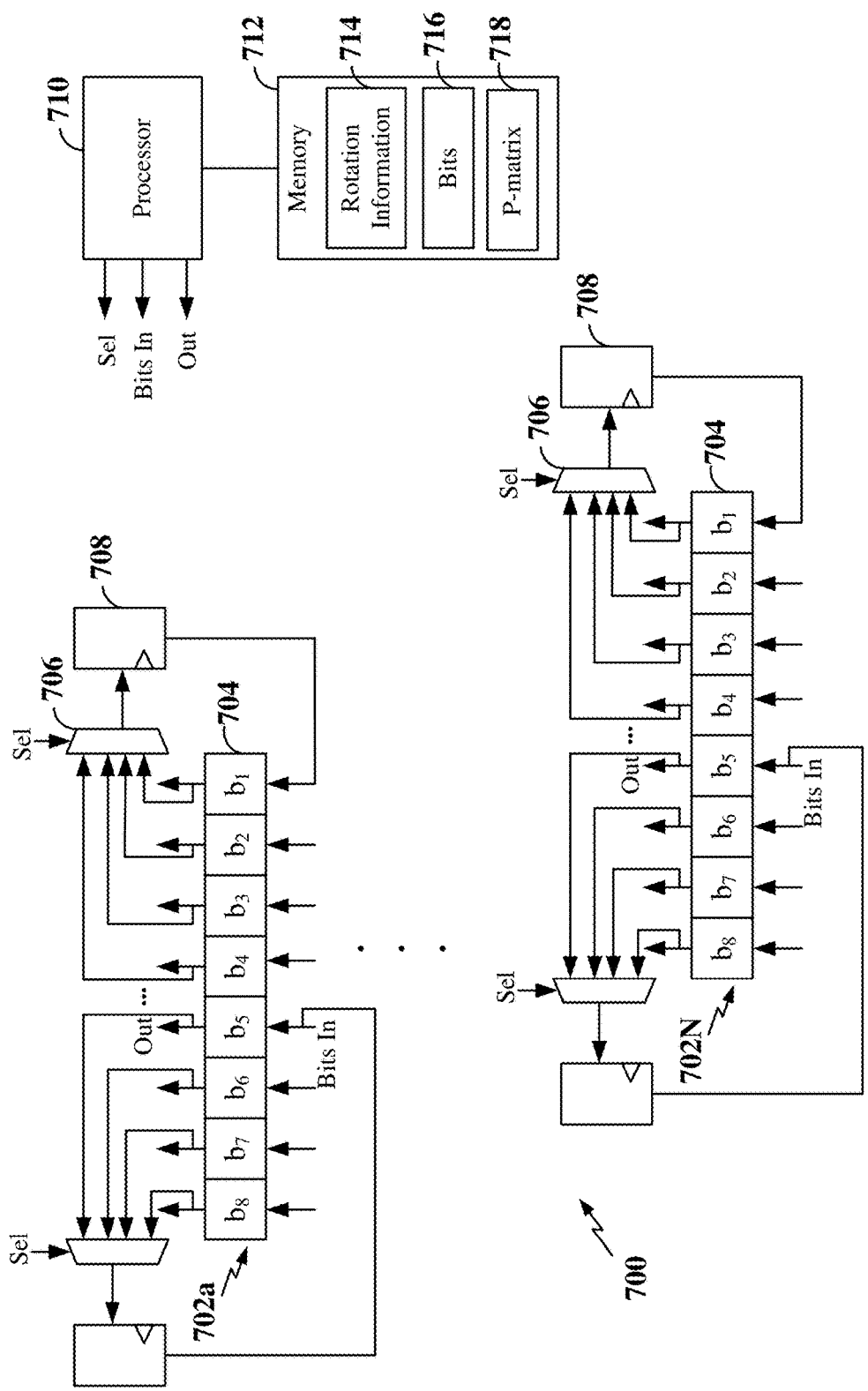
FIG. 7 is a diagram illustrating an exemplary shift register architecture for performing incremental P-matrix rotations according to some aspects of the present disclosure.

FIG. 7 is a diagram illustrating an exemplary shift register architecture 700 for performing incremental P-matrix rotations according to some aspects of the present disclosure. The shift register architecture 700 includes a plurality of shift registers 702a ... 702N, one for each of the information bit columns 606 shown in FIG. 6. However, for LDPC coding with a smaller number of information bits K and/or a smaller lift size Z, in some examples, one or more of the shift registers 702a ... 702N may be turned off. In other examples, one or more of the shift registers 702a ... 702N may include filler bits to fully fill the entire encoding matrix. In addition, in some examples, additional shift registers may also be included for each of the degree-three and/or degree-two parity bit columns 608 to enable calculation of the degree-one parity bits or parity check equations that may depend upon the rotation of the degree-three and/or degree-two parity bits. In one example, the shift register architecture 700 may include twenty-two information bit shift registers and four parity bit shift registers.

Each shift register 702a ... 702N may include a plurality of latches (registers) 704 (e.g., D-type flip-flops), each for storing a single bit. In some examples, the number of latches 704 within each shift register 702a ... 702N may be equal to the maximum (largest) possible lift size ($Z_{max}$). For example, each shift register 702a ... 702N may include three-hundred eighty-four latches 704, corresponding to $Z_{max}$=384. In the example shown in FIG. 7, each shift register 702a ... 702N contains eight latches 704, for simplicity. If the lift size Z utilized for LDPC coding is less than the largest possible lift size $Z_{max}$, some of the latches 704 within each shift register 702a ... 702N may be empty (e.g., number of empty latches=$Z_{max}$−Z). However, the operation of each shift register 702a ... 702N, as described below, remains the same regardless of the lift size Z.

Each of the shift registers 702a ... 702N may be a parallel-in to parallel-out shift register, in which a set of bits ($b_1$-$b_8$) corresponding to a particular column in the P-matrix may be loaded into a corresponding shift register within a single cycle in a parallel format. Similarly, after reaching a desired degree of rotation (e.g., corresponding to the submatrix identity indicated in an element of the respective column of the P-matrix), the resulting rotated set of bits may be transferred together directly to their respective outputs in a single cycle.

In some examples, the individual latches 704 within a shift register 702a may not be interconnected. Such a configuration may enable unused latches 704 to be turned off, thus saving power. For example, based on the lift size, one or more of the latches 704 within each of the shift registers 702a ... 702N may be bypassed.

In order to cyclically shift (incrementally rotate) the set of bits within each shift register 702a ... 702N, the input to each latch 704 may be coupled to a respective multiplexer 706. Each multiplexer 706 may be configured to receive the output of two or more latches 704 and to provide one of the received outputs to the input of a latch 704 via a respective D-type flip-flop 708. In the example shown in FIG. 7, each shift register 702a ... 702N may include a total of eight multiplexers 706 and eight corresponding flip-flops 708. However, for simplicity, only two of the multiplexers 706 and corresponding flip-flops 708 for each shift register 702a ... 702N are illustrated.

In the example shown in FIG. 7, each multiplexer 706 is a 4:1 mux, in which the outputs of four consecutive latches 704 may be input to a particular multiplexer 706. The multiplexer 706 may then select one of the four outputs to provide as an input to a latch 704 via the respective D-type flip-flop 708. It should be understood that each multiplexer 706 may receive the outputs of any number of latches 704 less than the total number of latches 704 (e.g., less than the total number of bit positions corresponding to the maximum lift size $Z_{max}$) within each shift register 702a ... 702N. However, in some examples, the number of multiplexer inputs may be as small as possible (e.g., 2, 4, or 8) in order to minimize the multiplexer area.

In some examples, as shown in FIG. 7, one of the latches 704 that transfers an output to a particular multiplexer 706 is the same latch 704 that receives an input from that particular multiplexer 706. This configuration enables each shift register 702a ... 702N to maintain the same bit positions from one cycle to the next, if needed. Thus, the configuration shown in FIG. 7 allows each shift register 702a ... 702N to cyclically shift (rotate) the set of bits between zero and three bit positions (degrees) per cycle. Therefore, the individual shift amount applied to each multiplexer 706 for a particular shift register (e.g., shift register 702a) during each cycle may be between zero and three, with the maximum shift amount corresponding to three bit positions (with wrap around to the left-most latch 704). The same individual shift amount is applied to each multiplexer 706 associated with a particular shift register to ensure all bits are maintained and are within the same relative order.

Therefore, the shift register architecture 700 shown in FIG. 7 enables each of the shift registers 702a ... 702N to incrementally rotate (cyclically shift) their respective sets of bits each cycle to achieve a respective individual shift amount corresponding to a number of bit positions. The respective individual shift amount of each shift register may be less than or equal to the maximum shift amount allowed per cycle, as determined by the multiplexer size (e.g., the number of multiplexer inputs).

Using the example of the shift register 702a shown in FIG. 7, the outputs of the latches 704 storing bits $b_1$-$b_4$ are coupled to a first multiplexer 706, while the outputs of the latches 704 storing bits $b_5$-$b_8$ are coupled to a second multiplexer 706. Thus, during a cycle, bits $b_1$-$b_4$ may transferred to the first multiplexer 706 and bits $b_5$-$b_8$ may be transferred to the second multiplexer 706. Based on a selected individual shift amount for the shift register 702a, as indicated by a respective input select (Sel) signal, the first multiplexer 706 transfers one of the bits $b_1$-$b_4$ to the input of the latch 704 that output bit $b_1$ and the second multiplexer 706 transfers one of the bits $b_5$-$b_8$ to the input of the latch 704 that output bit $b_5$. As indicated above, the same Sel signal is applied to each multiplexer 706 for the shift register 702a. Therefore, if the Sel signal indicates an individual shift amount of two bit positions, the first multiplexer 706 transfers bit $b_3$ to the input of the latch 704 that output bit $b_1$ and the second multiplexer 706 transfers bit $b_7$ to the input of the latch 704 that output bit $b_5$.

The respective input select (Sel) signal for each multiplexer 706 associated with each shift register 702a ... 702N may be generated by a processor 710 coupled to the shift register architecture 700. The processor 710 may further be coupled to a memory 712 maintaining rotation information 714 indicating the respective individual shift amount to be applied to each shift register 702a . . . 702N each cycle. Thus, the processor 710 may be configured to generate respective Sel signals each cycle for each of the multiplexers 706 for each of the shift registers 702a . . . 702N utilizing the rotation information 714 stored within the memory 712.

The memory 712 may further maintain the bits 716 (e.g., the information (systematic) bits to be encoded or the coded bits to be decoded) that are to be loaded into each of the shift registers 702a . . . 702N. The processor 710 may be configured to access the memory 712 to retrieve the respective set of bits (Bits In) for each of the shift registers 702a . . . 702N and load the respective sets of bits (Bits In) into the shift registers 702a . . . 702N during an initial cycle. The memory 712 may further maintain the P-matrix 718, and the processor 710 may further be configured to generate and transmit an output signal (Out) to each of the latches 704 within a particular shift register (e.g., shift register 702a) to output in parallel the rotated set of bits within the shift register 702a when the individual shift amount applied to the shift register 702a during a cycle results in a degree of rotation corresponding to an element within the respective column of the P-matrix 718.

The processor 710 may include one or more microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. The memory 712 may include one or more persistent memories, random access memories (RAMs), read only memories (ROMs), programmable ROMs (PROMs), removable disks, and/or any other suitable medium for storing the rotation information 714, bits 716, and P-matrix 718.

Figure 8:
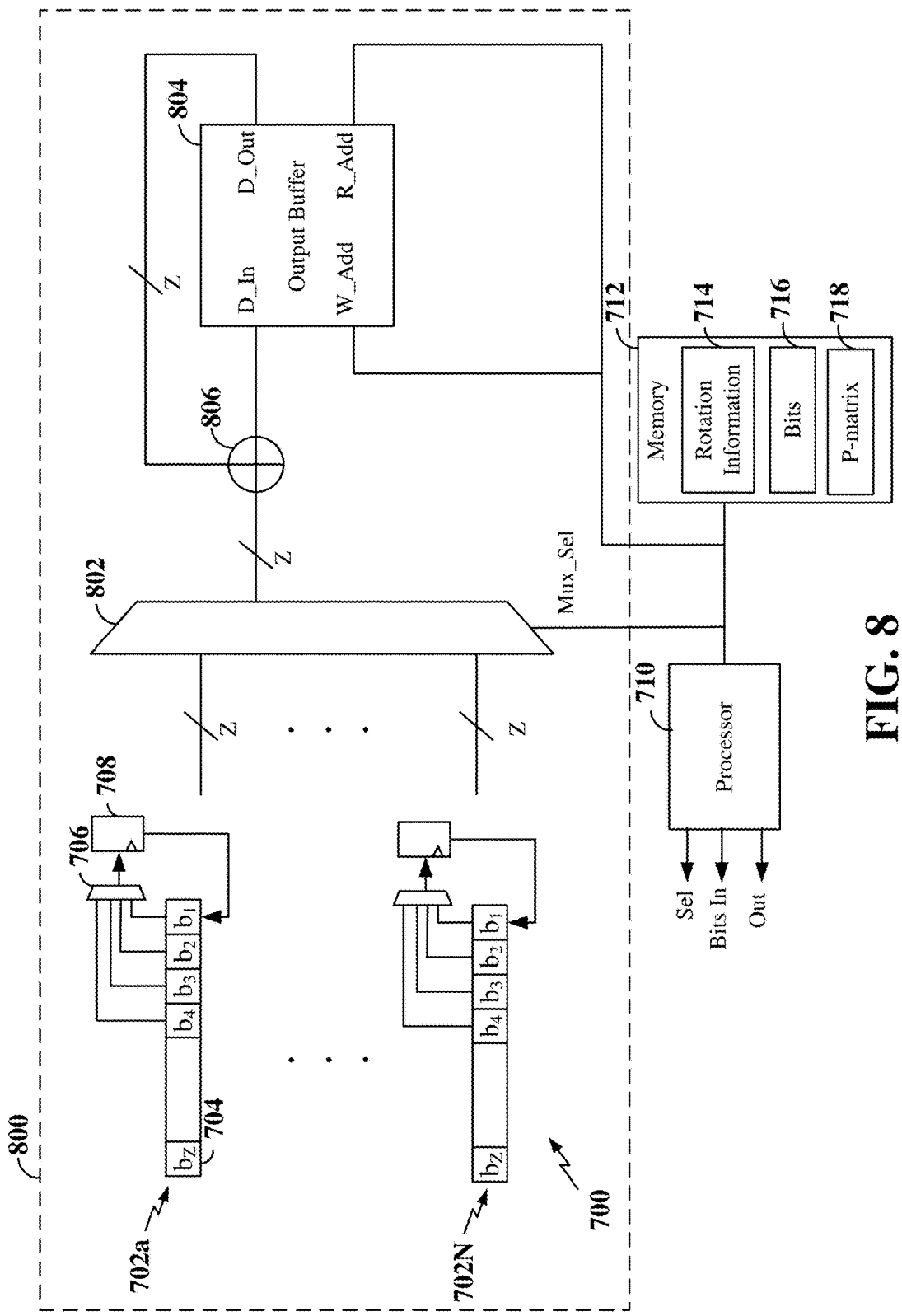
FIG. 8 is a diagram illustrating exemplary LDPC coding circuitry including the shift register architecture shown in FIG. 7 according to some aspects of the present disclosure.

FIG. 8 is a diagram illustrating exemplary LDPC coding circuitry 800 according to some aspects of the present disclosure. The LDPC coding circuitry 800 is coupled to the processor 710 and the memory 712 shown in FIG. 7 and also includes the shift register architecture 700 shown in FIG. 7. As described above, the shift register architecture 700 includes the plurality of shift registers 702a . . . 702N, each including a number of latches 704 equal to the maximum lift size $Z_{max}$. Thus, each shift register 702a . . . 702N may be configured to maintain and cyclically shift up to $b_{z\_max}$ bits. In a particular implementation, each shift register 702a . . . 702N may be loaded with a set of bits (e.g., $b_1$ . . . $b_z$) corresponding to the particular lift size Z utilized by the LDPC coding circuitry 800 for a particular encoding/decoding operation. As in FIG. 7, each set of bits (e.g., $b_1$ . . . $b_z$) loaded into each shift register 702a . . . 702N corresponds to a respective column in a particular P-matrix 718 utilized for the encoding/decoding operation. In some examples, each set of bits (Bits In) may be retrieved from the bits 716 (e.g., information bits or coded bits corresponding to the information bit columns of the P-matrix) maintained in the memory 712. For example, bits 1 through Z of the bits 716 may be loaded into a first shift register 702a, bits Z+1 through 2Z of the bits 716 may be loaded into a second shift register, and so on.

It should be understood that the LDPC coding circuitry 800 may be configured with multiple P-matrices (each of which may be stored within the memory 712) and the processor 710 may select a particular P-matrix 718 for the encoding/decoding operation. It should further be understood that each P-matrix 718 is associated with respective rotation information 714 that enables the appropriate individual shift amounts to be applied to each shift register 702a . . . 702N each cycle to produce the degrees of rotation indicated in the respective P-matrix 718. Thus, when the processor 710 selects a particular P-matrix 718, the processor 710 may access the rotation information 714 associated with the selected P-matrix 718 to perform the desired P-matrix rotations.

During each cycle, the processor 701 may further be configured to utilize the rotation information 714 associated with a selected P-matrix 718 to provide a respective input select (Sel) signal to each multiplexer 706 associated with each shift register 702a . . . 702N, thereby producing a respective selected individual shift amount for each shift register 702a . . . 702N. In particular, each multiplexer 706 may be configured to receive the output of two or more latches 704 and to provide one of the received outputs to the input of a latch 704 via a respective D-type flip-flop 708 based on the Sel signal. As indicated above, the same Sel signal is applied to each multiplexer 706 for a particular shift register 702a to maintain the same respective set of bits within the same relative order each cycle.

During a cycle, if the individual shift amount applied to a particular shift register (e.g., shift register 702a) results in a degree of rotation corresponding to an element within the respective column of the P-matrix 718, the processor 710 may further be configured to generate and transmit an output signal (Out) to each of the latches 704 within that particular shift register 702a to output in parallel the rotated set of bits within the shift register 702a. In the example shown in FIG. 8, the rotated set of bits output from the shift register 702a may be input to a multiplexer 802 within the LDPC coding circuitry 800. The rotated set of bits may further be maintained within the shift register 702a to perform further incremental rotations during subsequent cycles.

Each rotated set of bits output from a particular shift register 702a . . . 702N during a cycle includes Z bits corresponding to the respective set of bits rotated by an amount indicated in an element of the P-matrix. The multiplexer 802 may then select one or more rotated sets of bits to output towards an output buffer 804. In some examples, when the multiplexer 802 receives two or more rotated sets of bits during a cycle, the processor 710 may hold the rotation of the shift registers 702a . . . 702N for one or more cycles to enable the multiplexer 802 to output all of the received rotated sets of bits to the output buffer 804.

In some examples, the processor 710 may output a rotated set of bits from the multiplexer 802 by generating and transmitting a multiplexer select (Mux_Sel) signal to the multiplexer 802. The Mux_Sel signal may be generated based on the P-matrix 718 and the rotation information 714 maintained within the memory 712. When outputting a rotated set of bits from the multiplexer 802 to the output buffer 804, the processor 710 may further generate and transmit a write address command/instruction (W_Add) to the output buffer 804 indicating an address to write the rotated set of bits within the output buffer 804. The rotated set of bits may then be received at an input (D_In) of the output buffer 804 and stored in the output buffer 804 based on the W_Add received for the rotated set of bits.

After a first rotated set of bits associated with a first row in the P-matrix 718 is stored in the output buffer 804, the processor 710 may then identify a second rotated set of bits corresponding to another element within the first row of the P-matrix 718 to be output from the multiplexer 802. The processor 710 may then be configured to instruct the output buffer 804 to retrieve the first rotated set of bits (e.g., by providing a read address command/instruction (R_Add) to the output buffer 804) and to provide the first rotated set of bits to a multiplier 806 via an output (D-Out) of the output buffer 804. The multiplier 806 may be configured to multiply the first set of rotated bits output from the output buffer 804 with the second set of rotated bits output from the multiplexer 802 to produce a partial result. In some examples, the multiplier 806 includes exclusive or (XOR) logic configured to XOR the first rotated set of bits with the second rotated set of bits to produce the partial result, where each of the first rotated set of bits, the second rotated set of bits, and the partial result include Z bits. The processor 710 may then be configured to provide another write address command/instruction (W_Add) to the output buffer 804 to write the partial result back to the output buffer 804.

The partial result stored in the output buffer 804 may then be utilized in subsequent multiplication (XOR) operations for the first row of the P-matrix 718 to produce a final result that may be stored in the output buffer 804. In examples in which the LDPC coding circuitry 800 is utilized for LDPC encoding, the final result may correspond to a set of parity bits corresponding to a parity column in the P-matrix or be utilized to compute a set of parity bits corresponding to a parity column in the P-matrix. In examples where the LDPC coding circuitry 800 is utilized in LDPC decoding, the final result may correspond to a parity-check result or be utilized to compute a parity check result (e.g., by XORing the final result with any degree-one parity bit elements in the row). In some examples, to improve the throughput and/or reduce the latency, the LDPC coding circuitry 800 may include two or more output buffers 804 to process two or more rotated sets of bits output from the multiplexer 802 in parallel or the output buffer may include one or more caches at the input of the output buffer to store one or more rotated set of bits while processing another rotated set of bits, each output from the multiplexer 802 during the same cycle.

For LDPC encoding, the final results from each of the rows within the core structure may be utilized to determine each of the degree-three and degree-two parity bits based on back substitution. Utilizing the example shown in FIG. 6, the parity bits corresponding to columns 22-25 of the P-matrix represent the degree-three and degree-two parity bits. For example, the parity bits corresponding to column 22 represent a first set of parity bits ($p_0$), the parity bits corresponding to column 23 represent a second set of parity bits ($p_1$), the parity bits corresponding to column 24 represent a third set of parity bits ($p_2$), and the parity bits corresponding to column 25 represent a fourth set of parity bits ($p_3$).

Each of the rows 602 in the P-matrix indicates a parity-check equation in which the modulo-2 addition (e.g., XOR) of each of the elements in a row equals zero. For example, the parity check equations for each of the first four rows may be as follows:

$$P_{307}s_0 \oplus P_{19}s_1 \oplus \ldots \oplus P_{341}s_{21} \oplus P_1 p_0 \oplus P_0 p_1 = 0$$

$$P_{76}s_0 \oplus P_{76}s_3 \oplus \ldots \oplus P_{112}s_{21} \oplus P_0 p_0 \oplus P_0 p_1 \oplus P_0 p_2 = 0$$

$$P_{205}s_0 \oplus P_{250}s_1 \oplus \ldots \oplus P_{13}s_{20} \oplus P_0 p_2 \oplus P_0 p_3 = 0$$

$$P_{276}s_0 \oplus P_{87}s_1 \oplus \ldots \oplus P_{357}s_{21} \oplus P_1 p_0 \oplus P_0 p_3 = 0.$$

where $P_i s_j$ indicates modulo-2 addition (XOR) of the set of bits ($s_j$) corresponding to the j-th column with the cyclic-permutation of the identity matrix indicated by the submatrix identity $P_i$ indicated in an element 610 of the j-th column.

Since each parity check equation equals zero, the parity check equations may also be equal to one another. Therefore, redundant elements in each equation may be canceled, thus leaving $P_0 p_0$ (which is equal to $p_0$) in the parity-check equation corresponding to the second row that may be solved for. Once $p_0$ is calculated (e.g., by using the final result from multiplying (XORing) each of the information bit elements in the third row), $p_0$ may be stored in the output buffer 804 or within the memory 712 and utilized to calculate the remaining degree-two parity bits $p_1$-$p_3$. For example, $p_0$ may be loaded into one of the parity bit shift registers to rotate $p_0$ by $P_1$ and then the rotated set of bits $P_1 p_0$ may be multiplied (XORed) with the partial results stored in the output buffer 804 for the first and fourth rows to obtain the respective sets of parity bits for $p_1$ and $p_3$, each of which may then be stored in the output buffer 804 or the memory 712. The remaining set of parity bits $p_2$ may then be obtained by multiplying (XORing) the set of parity bits $p_3$ with the final result stored in the output buffer 804 for the second row of the P-matrix. Each of the degree-two parity bits may then be loaded into a respective parity bit shift register to enable calculation of the degree-one parity bits.

For LDPC decoding, each of the degree-two and degree-three sets of parity bits in the P-matrix 718 may also be loaded into a respective shift register to enable computation of each of the parity-check equations indicated in the P-matrix (e.g., by XORing each of the information bit elements and each of the degree-two and degree-three parity bit elements in a row and storing the final results for each row in the output buffer 804). Thus, for the rows containing only degree-two and degree-three parity bits, the parity-check result from each of the parity-check equations for those rows is equal to the respective final results stored in the output buffer 804. Since the degree-one parity bits are only utilized in a single parity-check equation (for a single row) and no rotation of the degree-one parity bits is needed, the degree-one parity bits may be maintained, for example, within the memory 712 and multiplied (XORed) with the final results from corresponding ones of the rows to produce the parity-check results for those rows. After calculation of each of the parity-check equations indicated in each of the rows, the processor 710 may determine that the codeword is correctly received when the parity-check results from each of the parity-check equations equal zero.

Figure 9:
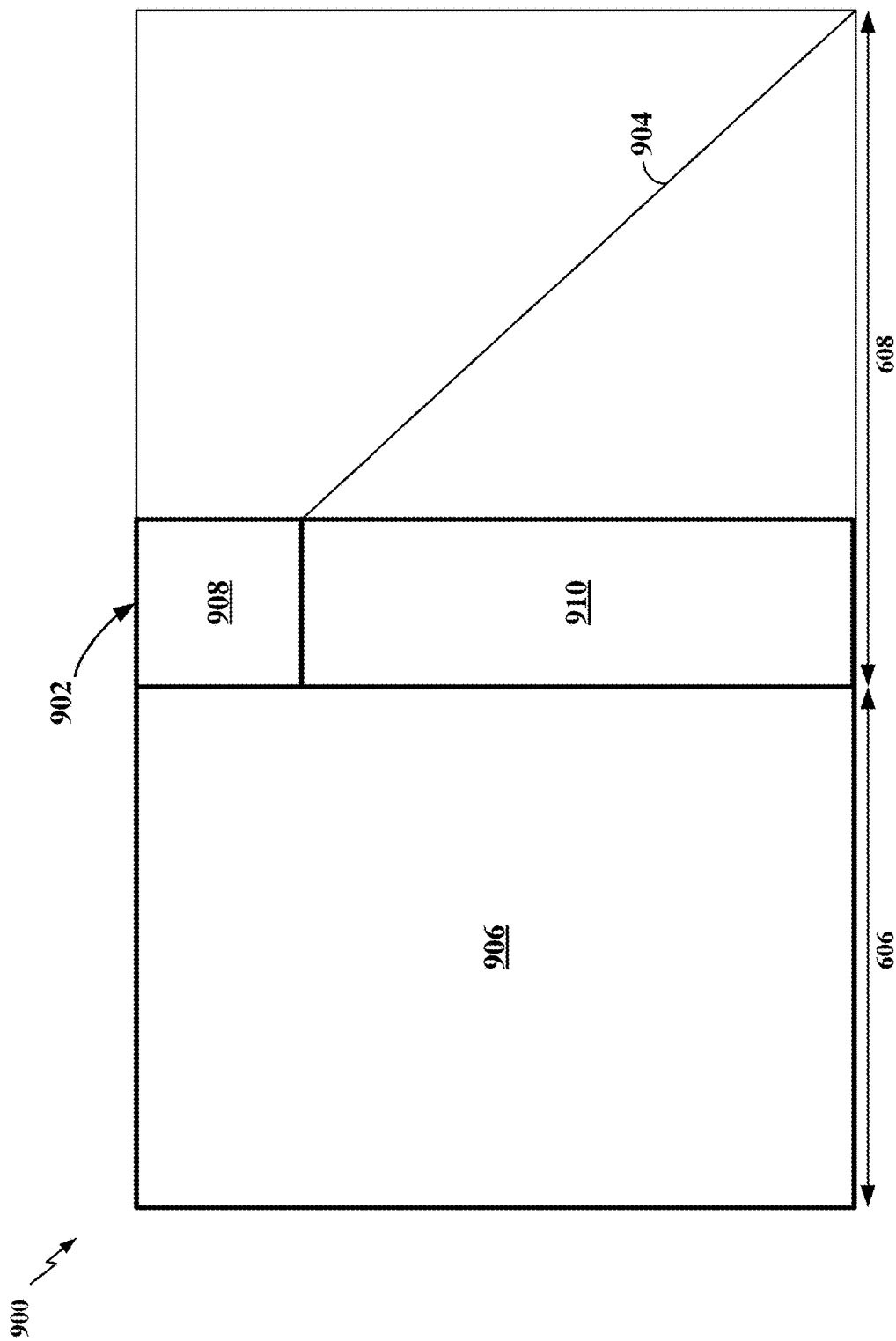
FIG. 9 illustrates exemplary rotation stages of a P-matrix according to some aspects of the present disclosure.

FIG. 9 is a diagram illustrating exemplary rotation stages of a P-matrix 900 according to some aspects of the present disclosure. The P-matrix 900 may, in some examples, be similar to the P-matrix shown in FIG. 6, in that the P-matrix 900 includes a plurality of rows and columns, where each of the rows represents a parity check equation and each of the columns represents a set of bits and each set of bits may include a number of bits corresponding to the lift size. As in the example shown in FIG. 6, the columns may be divided into information bit columns 606 and parity bit columns 608. The information bit columns 606 correspond to the information (systematic) bits, while the parity bit columns 608 correspond to the parity bits.

The parity bit columns 608 may further be divided into degree-two or higher parity bit columns 902 and degree-one parity bit columns 904. In some examples, the degree-two or higher parity bit columns 902 may correspond to columns 22-25 shown in FIG. 6 and/or the parity structure 504 shown in FIG. 5. The degree-one parity bit columns 904 may correspond to columns 26 and up in FIG. 6 and/or the degree-one parity bits 510 shown in FIG. 5.

To facilitate rotation of the information bits and parity bits, the rotations may be divided into two or more stages, with three stages, each corresponding to a respective section 906, 908, and 910 of the P-matrix 900, being illustrated in FIG. 9. The sets of bits corresponding to the columns in each section 906, 908, and 910 may be separately rotated between 0 and $Z_{max}$ (or the maximum rotation indicated in a column in that section). As such, each stage includes a number of cycles necessary to perform the rotations indicated in that section 906, 908, or 910.

In a first stage corresponding to a first section 906 of the P-matrix, all of the information bits may be rotated according to the rotations listed in the information bit columns 606 of the P-matrix 900. The partial results from each row of the P-matrix 900 may then be stored in the output buffer after rotation of all of the information bits.

In a second stage corresponding to a second section 908 of the P-matrix 900, the degree-three and/or degree-two parity bits may be rotated, as indicated in the parity bit columns 608 of the P-matrix, to generate the degree-three and/or degree-two parity bits 902. Using the example shown in FIG. 6, once the parity bits corresponding to parity bit column 22 ($p_0$) are calculated (e.g., by using the final result from multiplying (XORing) each of the information bit elements in the third row), $p_0$ may be loaded into one of the parity bit shift registers to rotate $p_0$ to obtain the respective sets of parity bits for $p_1$ and $p_3$, each of which may then be loaded into a respective parity bit shift register to enable calculation of the remaining degree-three and/or degree-two parity bits, which may then be loaded into respective shift registers for subsequent degree-one parity bit calculations.

In a third stage corresponding to a third section 910 of the P-matrix, the degree-three and/or degree-two parity bits may be further rotated, as indicated in the parity bit columns 608 of the P-matrix 900, to generate the degree-one parity bits 904. The latency in this stage depends on the number of elements in this section 910 of the P-matrix and the maximum number of bit positions that may be shifted each cycle. In some examples, the shift register multiplexers utilized for the degree-three and/or degree-two parity bits may enable higher maximum shift amounts per cycle (e.g., the number of multiplexer inputs may be greater) than the information bit shift register multiplexers. Each of the stages may be implemented, for example, during an initial transmission.

In some examples, retransmissions may involve only a single stage, in which rotations of all information and parity bits (e.g., bits corresponding to P-matrix columns in sections 906, 908, and 910) occur during a single set of cycles (e.g., all information bits and degree-three and/or degree-two parity bits are rotated together between 0 and $Z_{max}$ or the maximum rotation indicated in the section).

FIG. 10 is a diagram illustrating an exemplary rotation of a portion of the P-matrix shown in FIG. 6 over time according to some aspects of the present disclosure. The diagram illustrates the rotation operations performed on each of the information bit columns (Columns 0-21) over time. In the example shown in FIG. 10, each shift register utilizes 4:1 multiplexers to cyclically shift the bits within the shift registers. Thus, during each cycle, the respective set of bits within each shift register may be shifted a maximum of three bit positions. The incremental shifting (rotation) of bits (e.g., from 0 to 384 bit positions) is illustrated in the left-most column of the diagram, while each box under each information bit column illustrates the cycle count.

In the example shown in FIG. 10, during the initial cycle (Cycle 0), the respective sets of bits corresponding to each information bit column may be loaded into their respective shift registers. In addition, the set of bits within the shift register corresponding to Column 3 may be output to the multiplexer to transfer $P_0 \oplus s_3$ in the fourth row of Column 3 to the output buffer. During Cycles 1, 2, 3, and 4, the respective set of bits within each shift register are incrementally shifted the maximum shift amount (e.g., three bit positions). In Cycle 5, an individual shift amount of one bit position is applied to the respective set of bits within the shift register corresponding to Column 20 and the resulting rotated set of bits are output from the shift register to transfer $P_{13} \oplus s_{20}$ in the third row of Column 20 from the multiplexer to the output buffer. The respective sets of bits within the remaining shift registers are incrementally shifted the maximum shift amount (e.g., three bit positions). As such, after Cycle 5, all shift registers except the shift register associated with Column 20 have cyclically shifted their respective sets of bits by fifteen bit positions. The shift register associated with Column 20 has cyclically shifted its respective set of bits by thirteen bit positions.

In Cycle 6, an individual shift amount of two bit positions is applied to the respective set of bits within the shift register corresponding to Column 12 and the resulting rotated set of bits are output from the shift register to transfer $P_{17} \oplus s_{12}$ in the first row of Column 12 from the multiplexer to the output buffer. The respective sets of bits within the remaining shift registers are incrementally shifted the maximum shift amount (e.g., three bit positions). Therefore, at the end of Cycle 6, all shift registers except the shift registers associated with Columns 12 and 20 have cyclically shifted their respective sets of bits by eighteen bit positions. The shift register associated with Column 20 has cyclically shifted its respective set of bits by sixteen bit positions, while the shift register associated with Column 12 has cyclically shifted its respective set of bits by seventeen bit positions.

In Cycle 7, an individual shift amount of one bit position is applied to the respective set of bits within the shift register corresponding to Column 1 and the resulting rotated set of bits are output from the shift register to transfer $P_{19} \oplus s_1$ in the first row of Column 1 from the multiplexer to the output buffer. The respective sets of bits within the remaining shift registers are incrementally shifted the maximum shift amount (e.g., three bit positions). Therefore, at the end of Cycle 8, all shift registers except the shift registers associated with Columns 1, 12 and 20 have cyclically shifted their respective sets of bits by twenty-one bit positions. The shift registers associated with Columns 1 and 20 have each cyclically shifted their respective set of bits by nineteen bit positions, while the shift register associated with Column 12 has cyclically shifted its respective set of bits by twenty bit positions. The shift registers continue to incrementally shift their respective bits according to the P-matrix elements until all bits have been rotated 384 bit positions (or Z bit positions).

In some examples, if more than one shift register outputs a rotated set of bits during a single cycle (e.g., the rotation indicated in more than one P-matrix column is reached during a single cycle), depending on the output buffer configuration, less than all of the output rotated sets of bits may be processed during the cycle. Therefore, in some examples, the output rotated sets of bits that are not processed during the cycle may be held for one or more cycles to enable the output buffer to process each of the output rotated sets of bits. For example, assume that the shift amount applied to Column 12 occurred in Cycle 7 instead of Cycle 6. In this example, the respective rotated sets of bits within the shift registers corresponding to both Columns 1 and 12 would be output during Cycle 7. One of the rotated sets of bits (e.g., the rotated set of bits corresponding to Column 12) may be processed during Cycle 7. Then, in Cycle 8, the other rotated set of bits (e.g., the rotated sets of bits corresponding to Column 1) may be processed. Thus, in Cycle 8, a shift amount of zero would be applied to the shift register corresponding to Column 1 to hold the rotated set of bits corresponding to Column 1 in their current position until the rotated set of bits output from the shift register corresponding to Column 1 is processed. Rotations would then begin again for the shift register corresponding to Column 1 during Cycle 9.

Figure 11:
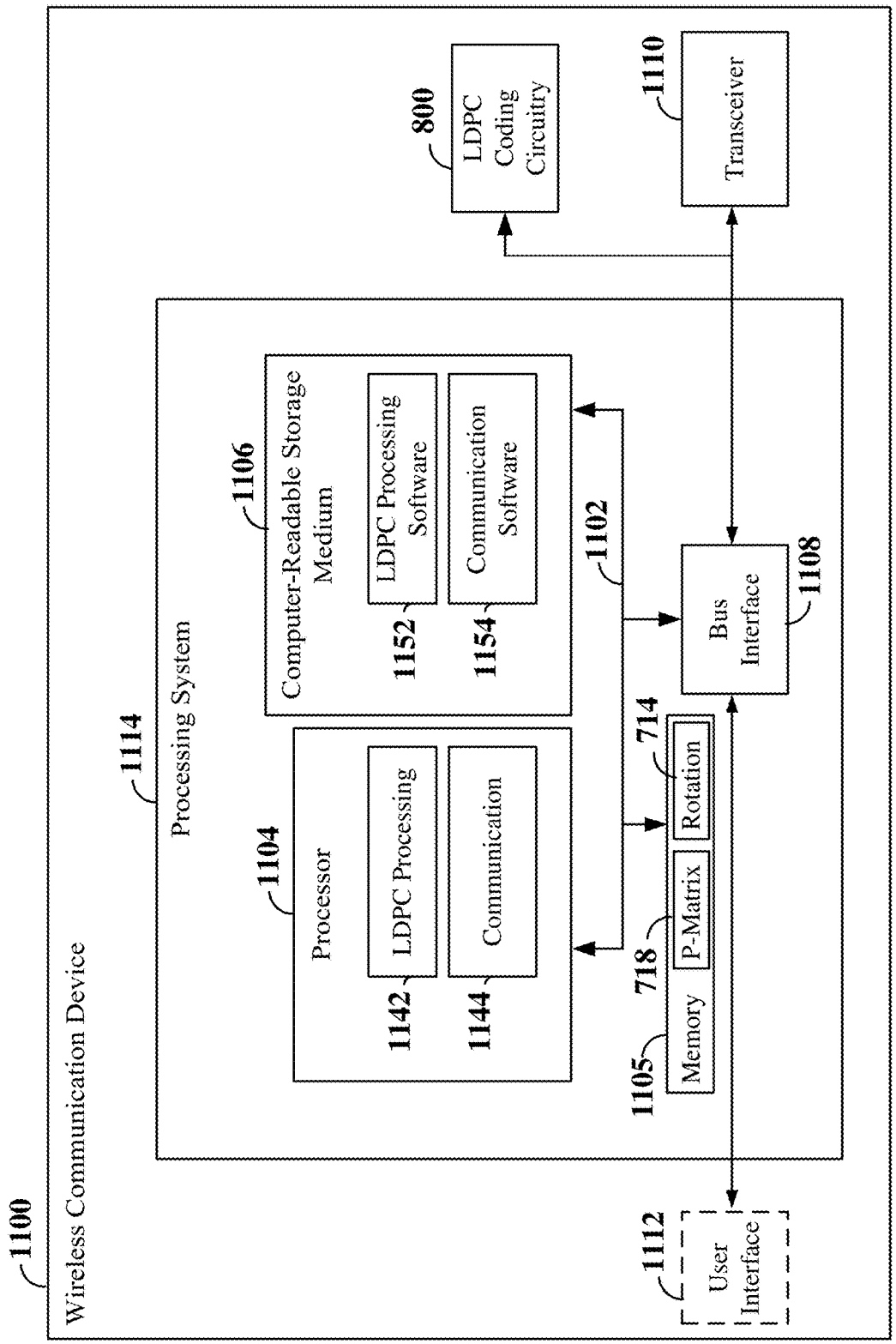
FIG. 11 is a block diagram illustrating an example of a hardware implementation for a wireless communication device employing a processing system according to some aspects of the present disclosure.

FIG. 11 is a diagram illustrating an example of a hardware implementation for an exemplary wireless communication device 1100 employing a processing system 1114. For example, the wireless communication device 1100 may be a user equipment (UE), a base station, or any other suitable apparatus or means for wireless communication.

The wireless communication device 1100 may be implemented with a processing system 1114 that includes one or more processors 1104. Examples of processors 1104 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the wireless communication device 1100 may be configured to perform any one or more of the functions described herein. That is, the processor 1104, as utilized in a wireless communication device 1100, may be used to implement any one or more of the processes described and illustrated in FIGS. 12-14. The processor 1104 may in some instances be implemented via a baseband or modem chip and in other implementations, the processor 1104 may itself comprise a number of devices distinct and different from a baseband or modem chip (e.g., in such scenarios is may work in concert to achieve embodiments discussed herein). And as mentioned above, various hardware arrangements and components outside of a baseband modem processor can be used in implementations, including RF-chains, power amplifiers, modulators, buffers, interleavers, adders/summers, etc.

In this example, the processing system 1114 may be implemented with a bus architecture, represented generally by the bus 1102. The bus 1102 may include any number of interconnecting buses and bridges depending on the specific application of the processing system 1114 and the overall design constraints. The bus 1102 communicatively couples together various circuits including one or more processors (represented generally by the processor 1104), a memory 1105, and computer-readable media (represented generally by the computer-readable medium 1106). The bus 1102 may also link various other circuits such as timing sources, peripherals, voltage regulators, and power management circuits, which are well known in the art, and therefore, will not be described any further. A bus interface 1108 provides an interface between the bus 1102 and a transceiver 1110. The transceiver 1110 provides a means for communicating with various other apparatus over a transmission medium (e.g., air). Depending upon the nature of the apparatus, an optional user interface 1112 (e.g., keypad, display, speaker, microphone, joystick) may also be provided. It should be understood that the user interface 1112 may not be provided in some devices, such as a base station.

The processor 1104 is responsible for managing the bus 1102 and general processing, including the execution of software stored on the computer-readable medium 1106. The software, when executed by the processor 1104, causes the processing system 1114 to perform the various functions described below for any particular apparatus. The computer-readable medium 1106 and the memory 1105 may also be used for storing data that is manipulated by the processor 1104 when executing software.

One or more processors 1104 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 1106. The computer-readable medium 1106 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer.

The computer-readable medium 1106 may reside in the processing system 1114, external to the processing system 1114, or distributed across multiple entities including the processing system 1114. The computer-readable medium 1106 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 1104 may include circuitry configured for various functions. For example, the processor 1104 may include low-density parity check (LDPC) processing circuitry 1142 configured to perform LDPC encoding and/or LDPC decoding. The LDPC processing circuitry 1142 may correspond to, for example, the processor 710 shown in FIGS. 7 and 8.

In some examples, the LDPC processing circuitry 1142 may be configured to receive an information block including a plurality of information (systematic) bits and may be configured to encode the information block using LDPC encoding based on a particular code rate. In some examples, the LDPC processing circuitry 1142 may be configured to select an LDPC base graph and identify the associated parity-check matrix (P-matrix) 718 maintained, for example, in memory 1105. An example of a portion of a P-matrix 718 that may be utilized in some examples is shown in FIG. 6. The LDPC processing circuitry 1142 may then utilize the selected P-matrix to encode the information block to produce a codeword for transmission over a wireless air interface to a receiving wireless communication device via the transceiver 1110. The codeword contains the information bits of the information block and parity check bits generated using the selected LDPC graph.

In various aspects of the present disclosure, the LDPC processing circuitry 1142 may further be configured to load respective sets of the information bits (e.g., corresponding to the lift size) into each of a plurality of shift registers within the LDPC coding circuitry 800, where each shift register is associated with a column of the selected P-matrix 718. The LDPC processing circuitry 1142 may then be configured to utilize the selected P-matrix 718 and associated rotation information 714 to incrementally cyclically shift the respective set of bits in each shift register to produce a plurality of rotated sets of bits corresponding to the degrees of rotation indicated in the elements of the selected P-matrix 718. The LDPC processing circuitry 1142 may further be configured to instruct the LDPC coding circuitry 800 to XOR the rotated sets of bits corresponding to at least the information bit elements in a row of the P-matrix to calculate the parity bits for the codeword.

In some examples, the LDPC processing circuitry 1142 may be configured to receive a codeword over a wireless air interface from a transmitting wireless communication device via the transceiver 1110 and decode the codeword utilizing LDPC decoding to produce an information block of a given block length. In some examples, the LDPC processing circuitry 1142 may be configured to select an LDPC base graph and identify the associated parity-check matrix (P-matrix) 718 maintained, for example, in memory 1105. The LDPC processing circuitry 1142 may then select an LDPC graph represented by the LDPC base graph and utilize the selected LDPC graph and associated P-matrix 718 to decode the codeword to produce the information block.

In various aspects of the present disclosure, the LDPC processing circuitry 1142 may further be configured to load respective sets of the coded bits (e.g., corresponding to the lift size) within the received codeword into each of a plurality of shift registers within the LDPC coding circuitry 800, where each shift register is associated with a column of the selected P-matrix 718. In some examples, the coded bits corresponding to the information bits and the degree-two and degree-three parity bits may be loaded into the shift registers. The LDPC processing circuitry 1142 may then be configured to utilize the selected P-matrix 718 and associated rotation information 714 to incrementally cyclically shift the respective set of bits in each shift register to produce a plurality of rotated sets of bits corresponding to the degrees of rotation indicated in the elements of the selected P-matrix. The LDPC processing circuitry may further be configured to instruct the LDPC coding circuitry 800 to XOR the rotated sets of bits and any stored degree-one parity bits corresponding to each element in a row of the P-matrix to calculate respective parity-check results for each of the parity-check equations for the codeword. The LDPC processing circuitry 1142 may operate in coordination with LDPC processing software 1152.

The processor 1104 may further include communication circuitry 1144. The communication circuitry 1144 may include one or more hardware components that provide the physical structure that performs various processes related to wireless communication (e.g., signal reception and/or signal transmission) as described herein. For example, the communication circuitry 1144 may be configured to transmit and/or receive a codeword encoded utilizing LDPC coding. The communication circuitry 1144 may operate in coordination with communication software 1154.

The circuitry included in the processor 1104 is provided as non-limiting examples. Other means for carrying out the described functions exists and is included within various aspects of the present disclosure. In some aspects of the disclosure, the computer-readable medium 1106 may store computer-executable code with instructions configured to perform various processes described herein. The instructions included in the computer-readable medium 1106 are provided as non-limiting examples. Other instructions config-ured to carry out the described functions exist and are included within various aspects of the present disclosure.

Figure 12:
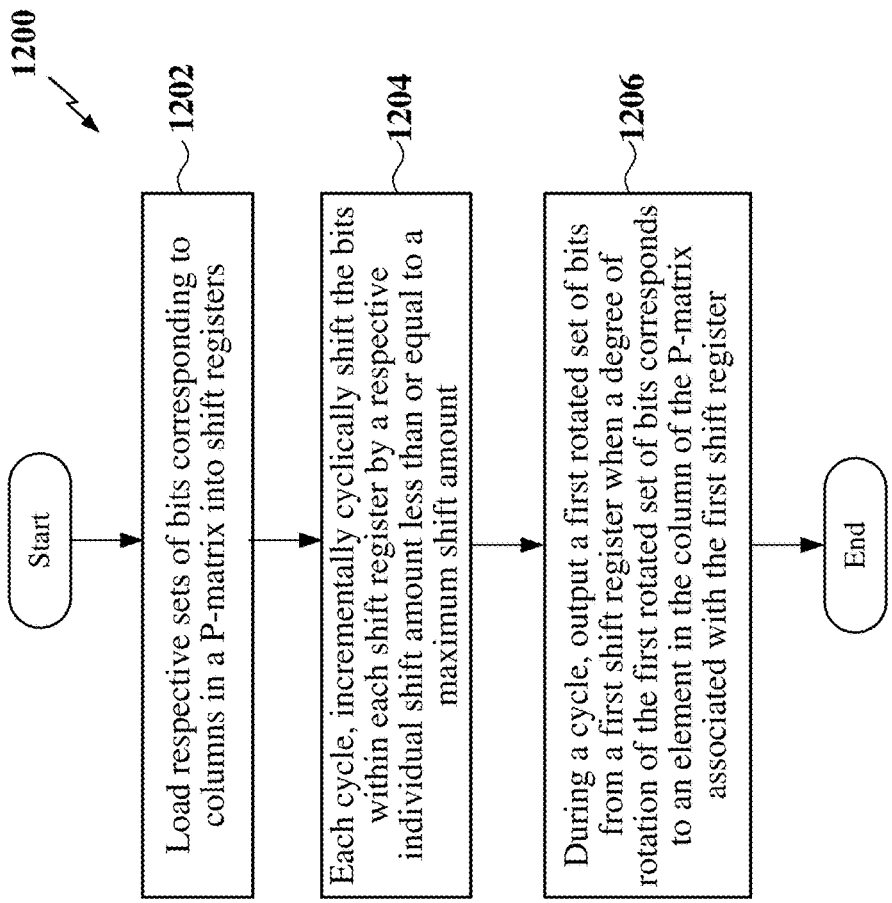
FIG. 12 is a flow chart of an exemplary method for P-matrix rotation utilized in LDPC coding according to some aspects of the present disclosure.

FIG. 12 is a flow chart illustrating an exemplary process 1200 for P-matrix rotation utilized in low-density parity check (LDPC) coding in accordance with some aspects of the present disclosure. As described below, some or all illustrated features may be omitted in a particular implementation within the scope of the present disclosure, and some illustrated features may not be required for implementation of all embodiments. In some examples, the process 1200 may be carried out by the wireless communication device illustrated in FIG. 11. In some examples, the process 1200 may be carried out by any suitable apparatus or means for carrying out the functions or algorithm described below.

At block 1202, the wireless communication device may load respective sets of bits corresponding to columns in a selected P-matrix into a plurality of shift registers. In some examples, the bits may be information (systematic) bits to be encoded. In other examples, the bits may be coded bits corresponding to at least the information bits in a codeword. For example, the LDPC processing circuitry 1142 shown and described above in reference to FIG. 11 may load the bits into the shift registers.

At block 1204, the wireless communication device may, each cycle, incrementally cyclically shift the respective set of bits within each shift register by a respective individual shift amount that is less than or equal to a maximum shift amount per cycle. In some examples, the maximum shift amount may be less than the number of bits within each of the respective sets of bits (e.g., less than the lift size) and may correspond to a number of bit positions within a shift register. In some examples, the maximum shift amount corresponds to three bit positions. For example, the LDPC processing circuitry 1142 shown and described above in reference to FIG. 11 may incrementally cyclically shift the bits within each shift register.

At block 1206, the wireless communication device may, during a cycle, output a first rotated set of bits from a first shift register when a degree of rotation of the first rotated set of bits corresponds to an element in a column of the P-matrix associated with the first shift register. For example, the degree of rotation within an element of the P-matrix column associated with the first shift register may be produced as a result of the individual shift amount applied to the first shift register. For example, the LDPC processing circuitry 1142 shown and described above in reference to FIG. 11 may output the first rotated set of bits from the first shift register.

Figure 13:
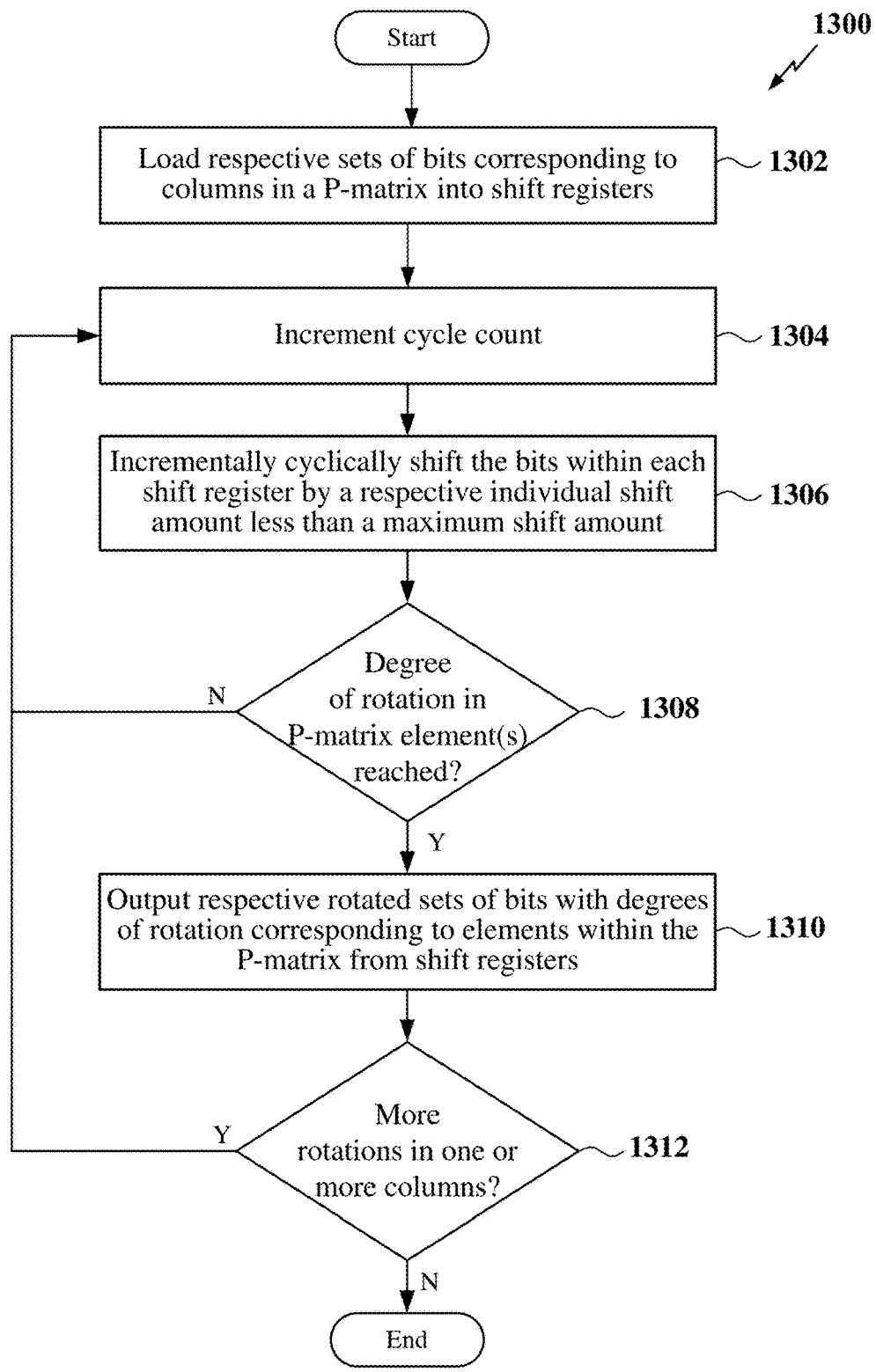
FIG. 13 is a flow chart of an exemplary method for P-matrix rotation utilized in LDPC coding according to some aspects of the present disclosure.

FIG. 13 is a flow chart illustrating an exemplary process 1300 for P-matrix rotation utilized low-density parity check (LDPC) coding in accordance with some aspects of the present disclosure. As described below, some or all illustrated features may be omitted in a particular implementation within the scope of the present disclosure, and some illustrated features may not be required for implementation of all embodiments. In some examples, the process 1300 may be carried out by the wireless communication device illustrated in FIG. 11. In some examples, the process 1300 may be carried out by any suitable apparatus or means for carrying out the functions or algorithm described below.

At block 1302, during an initial cycle, the wireless communication device may load respective sets of bits corresponding to columns in a selected P-matrix into a plurality of shift registers. In some examples, the bits may be information (systematic) bits to be encoded. In other examples, the bits may be coded bits corresponding to at least the information bits in a codeword. For example, the LDPC processing circuitry 1142 shown and described above in reference to FIG. 11 may load the bits into the shift registers.

At block 1304, the wireless communication device may increment the cycle count. For example, the LDPC processing circuitry 1142 shown and described above in reference to FIG. 11 may increment the cycle count upon receiving a next clock signal. At block 1306, the wireless communication device may incrementally cyclically shift the respective set of bits within each shift register by a respective individual shift amount that is less than or equal to a maximum shift amount per cycle. In some examples, the maximum shift amount may be less than the number of bits within each of the respective sets of bits (e.g., less than the lift size) and may correspond to a number of bit positions within a shift register. In some examples, the maximum shift amount corresponds to three bit positions. For example, the LDPC processing circuitry 1142 shown and described above in reference to FIG. 11 may incrementally cyclically shift the bits within each shift register.

At block 1308, the wireless communication device may determine whether a degree of rotation indicated in one or more P-matrix elements produced as a result of the respective individual shift amounts has been reached. For example, the LDPC processing circuitry 1142 shown and described above in reference to FIG. 11 may utilize the rotation information 714 and P-matrix 718 to determine whether the degree of rotation in one or more P-matrix elements has been reached during the current cycle.

If the degree of rotation in any of the P-matrix elements has not been reached (N branch of block 1308), each of the shift registers may be shifted by the maximum shift amount and the process returns to block 1304, where the cycle count may be incremented upon receiving the next clock signal. If the degree of rotation in one or more of the P-matrix elements has been reached (Y branch of block 1308), at block 1310, the wireless communication device may output respective rotated sets of bits with degrees of rotation corresponding to elements within the P-matrix from respective shift registers. For example, if during the current cycle, a degree of rotation indicated in P-matrix elements within two or more columns has been reached, the wireless communication device may output the rotated set of bits corresponding to each column from the respective shift registers associated with each column. For example, the LDPC processing circuitry 1142 shown and described above in reference to FIG. 11 may output the respective rotated sets of bits from the respective shift registers.

At block 1312, the wireless communication device may determine whether there are more rotations for one or more of the columns. For example, the wireless communication device may determine whether the respective set of bits corresponding to one or more P-matrix columns may be rotated additional bit positions (e.g., whether the maximum rotation corresponding to the maximum lift size $Z_{max}$ in each shift register has been reached). If there are more rotations (Y branch of block 1312), the process returns to block 1304, where the cycle count may be incremented upon receiving the next clock signal. If there are no more rotations (e.g., each shift register has been shifted the maximum number of times) (N branch of block 1312), the process ends.

Figure 14:
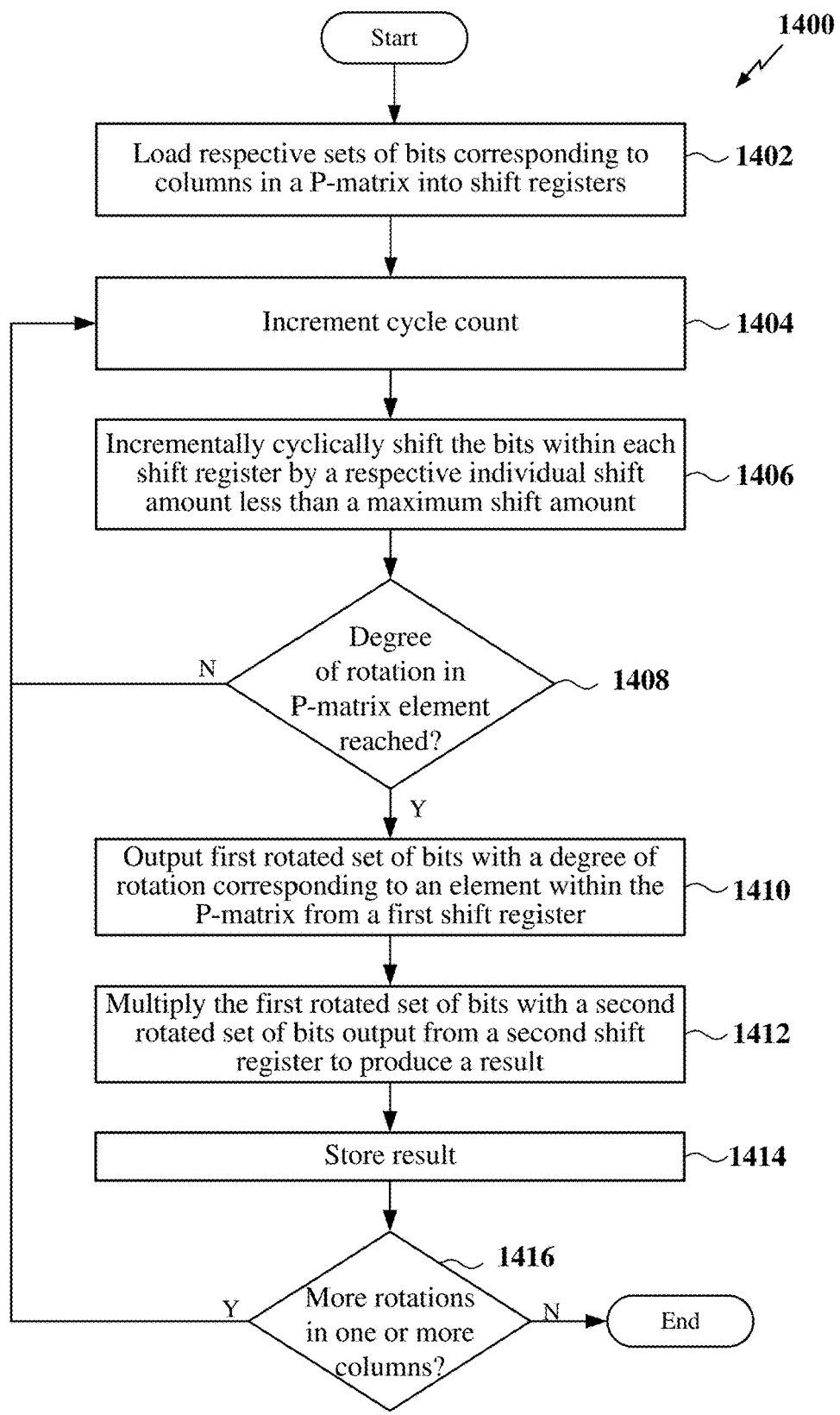
FIG. 14 is a flow chart of an exemplary method for LDPC coding based on P-matrix rotations according to some aspects of the present disclosure.

FIG. 14 is a flow chart illustrating an exemplary process 1400 for low-density parity check (LDPC) coding based on P-matrix rotations in accordance with some aspects of the present disclosure. As described below, some or all illustrated features may be omitted in a particular implementation within the scope of the present disclosure, and some illustrated features may not be required for implementation of all embodiments. In some examples, the process 1400 may be carried out by the wireless communication device illustrated in FIG. 11. In some examples, the process 1400 may be carried out by any suitable apparatus or means for carrying out the functions or algorithm described below.

At block 1402, during an initial cycle, the wireless communication device may load respective sets of bits corresponding to columns in a selected P-matrix into a plurality of shift registers. In some examples, the bits may be information (systematic) bits to be encoded. In other examples, the bits may be coded bits corresponding to at least the information bits in a codeword. For example, the LDPC processing circuitry 1142 shown and described above in reference to FIG. 11 may load the bits into the shift registers.

At block 1404, the wireless communication device may increment the cycle count. For example, the LDPC processing circuitry 1142 shown and described above in reference to FIG. 11 may increment the cycle count upon receiving a next clock signal. At block 1406, the wireless communication device may incrementally cyclically shift the respective set of bits within each shift register by a respective individual shift amount that is less than or equal to a maximum shift amount per cycle. In some examples, the maximum shift amount may be less than the number of bits within each of the respective sets of bits (e.g., less than the lift size) and may correspond to a number of bit positions within a shift register. In some examples, the maximum shift amount corresponds to three bit positions. For example, the LDPC processing circuitry 1142 shown and described above in reference to FIG. 11 may incrementally cyclically shift the bits within each shift register.

At block 1408, the wireless communication device may determine whether a degree of rotation indicated in a P-matrix element produced as a result of the respective individual shift amounts has been reached. For example, the LDPC processing circuitry 1142 shown and described above in reference to FIG. 11 may utilize the rotation information 714 and P-matrix 718 to determine whether the degree of rotation indicated in a P-matrix element has been reached during the current cycle.

If the degree of rotation in a P-matrix element has not been reached (N branch of block 1408), each of the shift registers may be shifted by the maximum shift amount and the process returns to block 1404, where the cycle count may be incremented upon receiving the next clock signal. If the degree of rotation in a P-matrix element has been reached (Y branch of block 1408), at block 1410, the wireless communication device may output a first rotated set of bits with a degree of rotation corresponding to a P-matrix element from a first shift register. For example, if during the current cycle, a degree of rotation indicated in a P-matrix element within a first column has been reached, the wireless communication device may output the first rotated set of bits corresponding to the first column from the first shift register. For example, the LDPC processing circuitry 1142 shown and described above in reference to FIG. 11 may output the first rotated set of bits from the first shift register.

At block 1412, the wireless communication device may multiply (XOR) the first rotated set of bits with a second rotated set of bits output from a second shift register to produce a result. In some examples, the result is a partial result based on XORing the rotated sets of bits corresponding to a portion of the elements (e.g., the information bit elements and the degree-three and/or degree-two parity bit elements) in a particular row of the P-matrix. In other examples, the result is a final result produced from XORing the rotated sets of bits corresponding to all of the information bit elements and the degree-three and/or degree-two parity bit elements in a P-matrix row. At block 1414, the wireless communication device may store the result. In some examples, if the result is a final result, the degree-three and/or degree-two parity bits may be stored in the shift registers for use in generating degree-one parity bits. For example, the LDPC processing circuitry 1142 shown and described above in reference to FIG. 11 may XOR the first and second rotated sets of bits and store the result within, for example, the output buffer 804 shown in FIG. 8.

At block 1416, the wireless communication device may determine whether there are more rotations for one or more of the columns. For example, the wireless communication device may determine whether the respective set of bits corresponding to one or more P-matrix columns may be rotated additional bit positions (e.g., whether the maximum rotation corresponding to the maximum lift size $Z_{max}$ in each shift register has been reached). If there are more rotations (Y branch of block 1416), the process returns to block 1404, where the cycle count may be incremented upon receiving the next clock signal. If there are no more rotations (e.g., each shift register has been shifted the maximum number of times) (N branch of block 1416), the process ends.

In one configuration, a wireless communication device (e.g., the wireless communication device 1100 shown in FIG. 11) configured for low-density parity check (LDPC) coding includes means for loading respective sets of bits corresponding to respective columns in a parity-check matrix into respective ones of a plurality of shift registers. The wireless communication device further includes means for incrementally cyclically shifting the respective sets of bits in each of the plurality of shift registers during a cycle of a plurality of cycles to achieve respective individual shift amounts less than or equal to a maximum shift amount per cycle, where the maximum shift amount is less than a number of bits within each of the respective sets of bits and the maximum shift amount corresponds to a number of bit positions. The wireless communication device further includes means for outputting a first rotated set of bits from a first shift register of the plurality of shift registers during the cycle when a degree of rotation of the respective set of bits within the first shift register produced as a result of the respective individual shift amount of the first shift register corresponds to an element within the respective column of the parity-check matrix associated with the first shift register.

In one aspect, the aforementioned means may be the processor(s) 1104 and LDPC coding circuitry 800 shown in FIG. 11 configured to perform the functions recited by the aforementioned means. For example, the aforementioned means may include the LDPC processing circuitry 1142 and LDPC coding circuitry 800 shown in FIG. 11. In still another aspect, the aforementioned means may be a circuit or any apparatus configured to perform the functions recited by the aforementioned means.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-14 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1, 2, 7, 8, and/or 11 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method utilized in low-density parity check (LDPC) coding, the method comprising:
    loading respective sets of bits corresponding to respective columns in a parity-check matrix into respective ones of a plurality of shift registers such that each of the plurality of shift registers comprises the respective set of bits corresponding to a single one of the columns;
    in each of a plurality of cycles, incrementally cyclically shifting the respective sets of bits in each of the plurality of shift registers to achieve respective individual shift amounts less than or equal to a maximum shift amount per cycle, wherein the maximum shift amount is less than a number of bits within each of the respective sets of bits and the maximum shift amount corresponds to a number of bit positions; and
    during a cycle of the plurality of cycles, outputting a first rotated set of bits comprising the number of bits from a first shift register of the plurality of shift registers when a degree of rotation of the respective set of bits within the first shift register produced as a result of the respective individual shift amount of the first shift register is equal to an identity of a lifted submatrix comprised within an element of the respective column of the parity-check matrix associated with the first shift register, wherein a cycle count associated with the plurality of cycles is incremented each clock signal.

2. The method of claim 1, wherein the respective sets of bits comprise respective sets of information bits to be encoded utilizing LDPC coding.

3. The method of claim 1, wherein the respective sets of bits comprise respective sets of coded bits to be decoded utilizing LDPC coding.

4. The method of claim 1, wherein incrementally cyclically shifting the respective sets of bits in each of the plurality of shift registers to achieve the respective individual shift amounts less than or equal to the maximum shift amount per cycle further comprises:
    during the cycle of the plurality of cycles:
        incrementally cyclically shifting a first set of bits in the first shift register to achieve a first individual shift amount; and
        incrementally cyclically shifting a second set of bits in a second shift register of the plurality of shift registers to achieve a second individual shift amount, wherein each of the first individual shift amount and the second individual shift amount are less than or equal to the maximum shift amount per cycle.

5. The method of claim 4, wherein outputting the first rotated set of bits from the first shift register of the plurality of shift registers further comprises:
    during the cycle of the plurality of cycles:
        outputting the first rotated set of bits corresponding to the first individual shift amount from the first shift register; and
        outputting a second set of rotated bits corresponding to the second individual shift amount from the second shift register;
    wherein the first individual shift amount results in a first degree of rotation of the first set of bits within the first shift register, the first degree of rotation corresponding to a first element within a first column of the parity-check matrix associated with the first shift register; and
    wherein the second individual shift amount results in a second degree of rotation of the second set of bits within the second shift register, the second degree of rotation corresponding to a second element within a second column of the parity-check matrix associated with the second shift register.

6. The method of claim 5, further comprising:
    during the cycle of the plurality of cycles, processing the first rotated set of bits; and
    during a next cycle of the plurality of cycles,
        processing the second rotated set of bits; and
        holding the second rotated set of bits in a current position thereof within the second shift register.

7. The method of claim 1, wherein incrementally cyclically shifting the respective sets of bits in each of the plurality of shift registers to achieve the respective individual shift amounts less than or equal to the maximum shift amount per cycle further comprises:
    during a first cycle of the plurality of cycles, incrementally cyclically shifting a first set of bits in the first shift register to achieve a first individual shift amount; and
    during a second cycle of the plurality of cycles, incrementally cyclically shifting the first set of bits in the first shift register to achieve a second individual shift amount, wherein each of the first individual shift amount and the second individual shift amount are less than or equal to the maximum shift amount per cycle.

8. The method of claim 7, wherein the first individual shift amount is different than the second individual shift amount.

9. The method of claim 1, further comprising:
    multiplying the first rotated set of bits with a second rotated set of bits output from a second shift register of the plurality of shift registers to produce a partial result, wherein the first rotated set of bits and the second rotated set of bits are each included in a first parity check equation indicated by the parity-check matrix; and
    storing the partial result for use in one or more subsequent multiplication operations to produce a final result.

10. The method of claim 9, further comprising:
    computing a first set of parity bits corresponding to a first parity column in the parity-check matrix utilizing the final result.

11. The method of claim 9, further comprising:
    computing a parity-check result of the first parity-check equation utilizing the final result.

12. The method of claim 9, further comprising:
    receiving the first rotated set of bits by a multiplexer;
    providing the first rotated set of bits from the multiplexer to an output buffer, and wherein multiplying the first rotated set of bits with the second rotated set of bits further comprises:

performing an XOR operation on the first set of rotated bits output from the output buffer and the second set of rotated bits output from the multiplexer to produce the partial result.

13. The method of claim 12, wherein storing the partial result for use in one or more subsequent multiplication operations to produce the final result further comprises:
storing the partial result within the output buffer.

14. The method of claim 1, wherein incrementally cyclically shifting the respective sets of bits in each of the plurality of shift registers is performed during an initial stage of an initial transmission, and further comprising:
during each of at least two additional stages of the initial transmission, repeating the incrementally cyclically shifting the respective sets of bits in each of the plurality of shift registers to compute respective sets of parity bits during each of the at least two additional stages.

15. The method of claim 1, wherein the respective individual shift amount of at least one of the plurality of shift registers is greater than one.

16. An apparatus configured for low-density parity check (LDPC) coding, comprising:
a memory configured to maintain a parity-check matrix;
LDPC coding circuitry comprising a plurality of shift registers, each coupled to a plurality of multiplexers; and
a processor communicatively coupled to the LDPC coding circuitry and the memory, the processor configured to:
load respective sets of bits corresponding to respective columns in the parity-check matrix into respective ones of the plurality of shift registers such that each of the plurality of shift registers comprises the respective set of bits corresponding to a single one of the columns;
in each of a plurality of cycles, incrementally cyclically shift the respective sets of bits in each of the plurality of shift registers utilizing the plurality of multiplexers to achieve respective individual shift amounts less than or equal to a maximum shift amount per cycle, wherein the maximum shift amount is less than a number of bits within each of the respective sets of bits and the maximum shift amount corresponds to a number of bit positions; and
during a cycle of the plurality of cycles, output a first rotated set of bits comprising the number of bits from a first shift register of the plurality of shift registers when a degree of rotation of the respective set of bits within the first shift register produced as a result of the respective individual shift amount of the first shift register is equal to an identity of a lifted submatrix comprised within an element of the respective column of the parity-check matrix associated with the first shift register, wherein a cycle count associated with the plurality of cycles is incremented each clock signal.

17. The apparatus of claim 16, wherein the processor is further configured to:
during the cycle of the plurality of cycles:
incrementally cyclically shift a first set of bits in the first shift register to achieve a first individual shift amount; and
incrementally cyclically shift a second set of bits in a second shift register of the plurality of shift registers to achieve a second individual shift amount, wherein each of the first individual shift amount and the second individual shift amount are less than or equal to the maximum shift amount per cycle.

18. The apparatus of claim 17, wherein the processor is further configured to:
during the cycle of the plurality of cycles:
output the first rotated set of bits corresponding to the first individual shift amount from the first shift register; and
output a second set of rotated bits corresponding to the second individual shift amount from the second shift register;
wherein the first individual shift amount results in a first degree of rotation of the first set of bits within the first shift register, the first degree of rotation corresponding to a first element within a first column of the parity-check matrix associated with the first shift register; and
wherein the second individual shift amount results in a second degree of rotation of the second set of bits within the second shift register, the second degree of rotation corresponding to a second element within a second column of the parity-check matrix associated with the second shift register.

19. The apparatus of claim 16, wherein the processor is further configured to:
during a first cycle of the plurality of cycles, incrementally cyclically shift a first set of bits in the first shift register to achieve a first individual shift amount; and
during a second cycle of the plurality of cycles, incrementally cyclically shift the first set of bits in the first shift register to achieve a second individual shift amount, wherein each of the first individual shift amount and the second individual shift amount are less than or equal to the maximum shift amount per cycle.

20. The apparatus of claim 19, wherein the first individual shift amount is different than the second individual shift amount.

21. The apparatus of claim 16, wherein the processor is further configured to:
multiply the first rotated set of bits with a second rotated set of bits output from a second shift register of the plurality of shift registers to produce a partial result, wherein the first rotated set of bits and the second rotated set of bits are each included in a first parity check equation indicated by the parity-check matrix; and
store the partial result for use in one or more subsequent multiplication operations to produce a final result.

22. The apparatus of claim 21, wherein the processor is further configured to:
compute a first set of parity bits corresponding to a first parity column in the parity-check matrix utilizing the final result.

23. The apparatus of claim 21, wherein the LDPC coding circuitry further comprising:
an output multiplexer coupled to receive the first rotated set of bits; and
an output buffer coupled to receive the first rotated set of bits from the output multiplexer.

24. The apparatus of claim 23, wherein the LDPC coding circuitry further comprises:
exclusive or (XOR) circuitry configured to receive the first rotated set of bits from the output buffer and the second rotated set of bits from the output multiplexer, wherein the XOR circuitry is further configured to perform an XOR operation on the first set of rotated bits and the second set of rotated bits to produce the partial result.

25. The apparatus of claim 24, wherein the processor is further configured to:
store the partial result within the output buffer.

26. A wireless communication device configured for low-density parity check (LDPC) coding, comprising:
means for loading respective sets of bits corresponding to respective columns in a parity-check matrix into respective ones of a plurality of shift registers such that each of the plurality of shift registers comprises the respective set of bits corresponding to a single one of the columns;
means for incrementally cyclically shifting the respective sets of bits in each of the plurality of shift registers during a cycle of a plurality of cycles to achieve respective individual shift amounts less than or equal to a maximum shift amount per cycle, wherein the maximum shift amount is less than a number of bits within each of the respective sets of bits and the maximum shift amount corresponds to a number of bit positions; and
means for outputting a first rotated set of bits comprising the number of bits from a first shift register of the plurality of shift registers during the cycle when a degree of rotation of the respective set of bits within the first shift register produced as a result of the respective individual shift amount of the first shift register is equal to an identity of a lifted submatrix comprised within an element of the respective column of the parity-check matrix associated with the first shift register, wherein a cycle count associated with the plurality of cycles is incremented each clock signal.

27. The wireless communication device of claim 26, wherein the means for incrementally cyclically shifting the respective sets of bits in each of the plurality of shift registers during the cycle to achieve the respective individual shift amounts less than or equal to the maximum shift amount per cycle further comprises:
means for incrementally cyclically shifting a first set of bits in the first shift register during the cycle to achieve a first individual shift amount; and
means for incrementally cyclically shifting a second set of bits in a second shift register of the plurality of shift registers during the cycle to achieve a second individual shift amount, wherein each of the first individual shift amount and the second individual shift amount are less than or equal to the maximum shift amount per cycle.

28. The wireless communication device of claim 27, wherein the means for outputting the first rotated set of bits from the first shift register of the plurality of shift registers further comprises:

means for outputting the first rotated set of bits corresponding to the first individual shift amount from the first shift register during the cycle; and
means for outputting a second set of rotated bits corresponding to the second individual shift amount from the second shift register during the cycle;
wherein the first individual shift amount results in a first degree of rotation of the first set of bits within the first shift register, the first degree of rotation corresponding to a first element within a first column of the parity-check matrix associated with the first shift register; and
wherein the second individual shift amount results in a second degree of rotation of the second set of bits within the second shift register, the second degree of rotation corresponding to a second element within a second column of the parity-check matrix associated with the second shift register.

29. The wireless communication device of claim 26, wherein the means for incrementally cyclically shifting the respective sets of bits in each of the plurality of shift registers to achieve the respective individual shift amounts less than or equal to the maximum shift amount per cycle further comprises:
means for incrementally cyclically shifting a first set of bits in the first shift register during a first cycle of the plurality of cycles to achieve a first individual shift amount; and
means for incrementally cyclically shifting the first set of bits in the first shift register during a second cycle of the plurality of cycles to achieve a second individual shift amount, wherein each of the first individual shift amount and the second individual shift amount are less than or equal to the maximum shift amount per cycle.

30. The wireless communication device of claim 26, further comprising:
means for multiplying the first rotated set of bits with a second rotated set of bits output from a second shift register of the plurality of shift registers to produce a partial result, wherein the first rotated set of bits and the second rotated set of bits are each included in a first parity check equation indicated by the parity-check matrix; and
means for storing the partial result for use in one or more subsequent multiplication operations to produce a final result.

31. The wireless communication device of claim 30, wherein the means for multiplying the first rotated set of bits with the second rotated set of bits further comprises: means for performing an exclusive or (XOR) operation on the first rotated set of bits and the second set of rotated bits to produce the partial result.

* * * * *